United States Patent
Schneider et al.

(10) Patent No.: US 10,779,392 B2
(45) Date of Patent: *Sep. 15, 2020

(54) ELECTRICAL ASSEMBLY WITH A MULTILAYER BUS BOARD

(71) Applicant: Interplex Industries, Inc., East Providence, RI (US)

(72) Inventors: Richard Schneider, Livonia, MI (US); Joseph J. Lynch, East Northport, NY (US); Craig Kennedy, San Marcos, CA (US); Vu Phan, Garden Grove, CA (US)

(73) Assignee: Interplex Industries, Inc., East Providence, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/580,507

(22) Filed: Sep. 24, 2019

(65) Prior Publication Data
US 2020/0060022 A1 Feb. 20, 2020

Related U.S. Application Data

(63) Continuation-in-part of application No. 15/552,116, filed as application No. PCT/US2016/018000 on Feb. 16, 2016, now Pat. No. 10,485,092.
(Continued)

(51) Int. Cl.
*H05K 1/02* (2006.01)
*H02G 5/00* (2006.01)
(Continued)

(52) U.S. Cl.
CPC ......... *H05K 1/0209* (2013.01); *H01R 12/526* (2013.01); *H02G 5/005* (2013.01);
(Continued)

(58) Field of Classification Search
CPC ...... H01R 12/526; H05K 1/18; H05K 1/0209; H05K 3/4679; H05K 3/429; H05K 2201/01; H05K 2201/2018; H05K 2201/0323; H05K 2201/10242; H05K 2201/10303; H02G 5/005
See application file for complete search history.

(56) References Cited

U.S. PATENT DOCUMENTS 5,920,461 A 7/1999 Brune
6,972,544 B2 12/2005 Seman, Jr.
(Continued)

FOREIGN PATENT DOCUMENTS

WO WO2020081492 A2 4/2020

*Primary Examiner* — Hoa C Nguyen
(74) *Attorney, Agent, or Firm* — Katterle Nupp LLC; Paul Katterle; Robert Nupp

(57) ABSTRACT

An electrical assembly having an electrical device electrically connected to a multilayer bus board, which has a multilayer stacked assembly that includes a plurality of electrically conductive layer structures and at least one dielectric layer structure disposed between an adjacent pair of the conductive layer structures. A frame formed of a dielectric material encapsulates at least a portion of the multilayer stacked assembly and mechanically maintains the conductive layer structures and the dielectric layer structure in secure aligned abutting relation.

20 Claims, 18 Drawing Sheets

Related U.S. Application Data

(60) Provisional application No. 62/153,710, filed on Apr. 28, 2015, provisional application No. 62/117,705, filed on Feb. 18, 2015.

(51) Int. Cl.
*H01R 12/52* (2011.01)
*H05K 3/42* (2006.01)
*H05K 3/46* (2006.01)
*H05K 1/18* (2006.01)

(52) U.S. Cl.
CPC .............. *H05K 1/18* (2013.01); *H05K 3/429* (2013.01); *H05K 3/4679* (2013.01); *H05K 2201/01* (2013.01); *H05K 2201/0323* (2013.01); *H05K 2201/10242* (2013.01); *H05K 2201/10303* (2013.01); *H05K 2201/2018* (2013.01)

(56) References Cited

U.S. PATENT DOCUMENTS

| | | |
|---|---|---|
| 9,112,336 B2 | 8/2015 | Samuelson |
| 9,147,875 B1 | 9/2015 | Coakley |
| 2008/0030830 A1 | 2/2008 | Yamaguchi et al. |
| 2009/0298218 A1* | 12/2009 | Federici ............ H01L 23/49861 |
| | | 438/65 |
| 2014/0212695 A1 | 7/2014 | Lane |
| 2015/0037662 A1* | 2/2015 | Pinon .................. H01M 2/0237 |
| | | 429/179 |
| 2015/0181707 A1* | 6/2015 | Kobayashi .............. B32B 15/14 |
| | | 428/206 |
| 2015/0214524 A1 | 7/2015 | Takasaki |
| 2017/0005371 A1 | 1/2017 | Chidester |
| 2017/0358832 A1 | 12/2017 | Sun |
| 2018/0108886 A1 | 4/2018 | Fees |
| 2018/0212222 A1 | 7/2018 | Barton |

* cited by examiner

ELECTRICAL ASSEMBLY WITH A MULTILAYER BUS BOARD

CROSS-REFERENCE TO RELATED APPLICATION(S)

This application is a continuation-in-part of U.S. patent application Ser. No. 15/552,116, filed on Aug. 18, 2017, which is a U.S. national stage application under 35 U.S.C. § 371 of International Application No.: PCT/US16/18000, filed on Feb. 16, 2016, which claims priority benefit under 35 U.S.C. § 119(e) to Provisional Patent Application No. 62/117,705, filed on Feb. 18, 2015 and Provisional Patent Application No. 62/153,710, filed on Apr. 28, 2015, all of the foregoing applications being herein incorporated by reference.

TECHNICAL FIELD

The present disclosure relates to multilayer bus boards and more specifically to multilayer bus boards that contain interspersed conductive and dielectric layer structures that are secured together by a physical structure.

BACKGROUND

Multilayer bus bars and bus boards (hereinafter referred to as "multilayer bus boards") have been routinely employed in electrical devices for power and signal distribution and take many different forms. Some bus boards known in the art employ a laminated construction in which conductive plates or layers are insulated from adjacent conductive layers by a dielectric layer disposed therebetween.

In one known construction, a multilayer sandwich is encapsulated in a solidifiable dielectric medium. Apertures are provided through the encapsulated structure and conductive pins or posts are driven through the structure so as to make electrical contact with, and electrically interconnect the stacked conductive plates. Such a structure is disclosed in U.S. Pat. No. 4,133,101. Other encapsulated multilayer bus bar and bus board structures are disclosed, for example, in U.S. Pat. No. 7,977,777 and US Published Application 2014/0185195. A method of forming a molded condenser is disclosed in U.S. Pat. No. 1,871,492.

In certain applications, it is desirable to make connection via a pin or terminal to one or more conductive layers of a multilayer bus board without making conductive contact with other layers of the multilayer bus board. In one construction in which the bus board is formed as an alternating sandwich of conductive and dielectric layers, openings are provided that are oversized in relation to a pin that will extend through the bus board and an insulating donut or sleeve is disposed in the opening prior to lamination of the layers to form the bus board. These dielectric layers are typically film based with epoxy based coatings that are used as bonding agents to the multiple conductive layers. When the pin is urged through the bus board, it makes contact with conductive layers that do not include such a sleeve and is insulated from layers containing such a sleeve. In these type of constructions epoxy coated dielectrics are typically covering at least most of the complete conductive layers because of the need for mechanical strength. This coating can restrict heat dissipation that is needed in certain high power switching circuits. Assembly of a multilayer bus board in this manner involves selective placement of the insulating sleeves within specified openings of the conductive layers. This procedure as well as setting times of the epoxy based dielectrics can be time consuming in the manufacturing process, costly and volume restrictive. It would therefore be desirable to have a bus board and method for producing the same core construction that allowed for high volume production, permitted interconnection of terminals or pins, was able to be designed to allow for heat dissipation, able to add features of topography for locational and mechanical holding and add dielectric insulator via holes as needed without added parts to selected layers of the multilayer bus board.

These prior art systems typically use metal powder coating or epoxy based lamination insulators and additional insulators in the form of inserts to create pass-through channels for conductors to get to the adjacent layers. The lamination process to put this all together is similar to lamination of PCBs, and take up to 40 minutes to an hour for the lamination process. The end product can be bent and formed but is featureless with regards to locaters, bolt-throughs, etc.

To avoid high inductance, bus conductors need to be electrically balanced so that current flows equally and in the opposite direction through each adjacent conductive sheet. When so connected, their opposing fields will effectively cancel each other. The closer the conductors are together, the greater this cancellation effect. Therefore, the dielectric material selected should be as thin as possible while still having a dielectric strength appropriately in excess of the application voltage, resulting in little added circuit inductance. Closer, thinner, and wider conductors are the key to reducing total circuit inductance getting maximum performance. Another prior art approach is just to put two copper sheets in a molding process and hold them apart an allow plastic to flow between them. This approach may be insufficient for today's technology as the industry requires very thin bus layers. Thin gaps between the opposing potentials with high dielectric between the layers keeps inductance low as switching speeds rise. Larger spacing and thick bus layers generate higher inductance as with the laminated approach.

There is also a growing need to move to very high temperatures (greater than 250° C.) because of the higher chip temperatures, however many current lamination materials have trouble at higher temps, which creates additional problems to solve.

With power density growth, multilayer bus board assemblies need to become more compact. There is a need to connect subassemblies within various power assemblies and modules in a mechanically condensed and electrically efficient manner. High voltage assemblies up to but not limited to 1200 volts need opposite polarity conductive planes between subassemblies that are compact, deploy shapes and location features so that subassemblies and parts can be nested together in one assembly with one common power plane. In the application case of high power switching circuits like insulated-gate bipolar transistors (IGBTs) these power planes need to support high capacitance with low inductance so as not to cause overvoltage which would adversely affect switching speeds.

SUMMARY

In accordance with the disclosure, an electrical assembly is provided that includes a multilayer busboard and an electrical device. The multilayer busboard includes a multilayer stacked assembly having a plurality of layer structures. The layer structures include a pair of electrically conductive layer structures and a dielectric layer structure disposed between and adjoining each of the conductive layer structures. The multilayer busboard also includes a molded frame. The frame is formed of an insulating polymer material and has a peripheral portion encapsulating end portions of the dielectric layer structure and the conductive layer structures to maintain the conductive layer structures and the dielectric layer structure in position relative to each other. The frame defines an enlarged opening through which an external surface of an outer one of the layer structures is exposed. The electrical device is electrically connected to one or both of the conductive layer structures.

BRIEF DESCRIPTION OF THE DRAWINGS

The features, aspects, and advantages of the present disclosure will become better understood with regard to the following description, appended claims, and accompanying drawings where:

DETAILED DESCRIPTION OF ILLUSTRATIVE EMBODIMENTS

Figure 1:
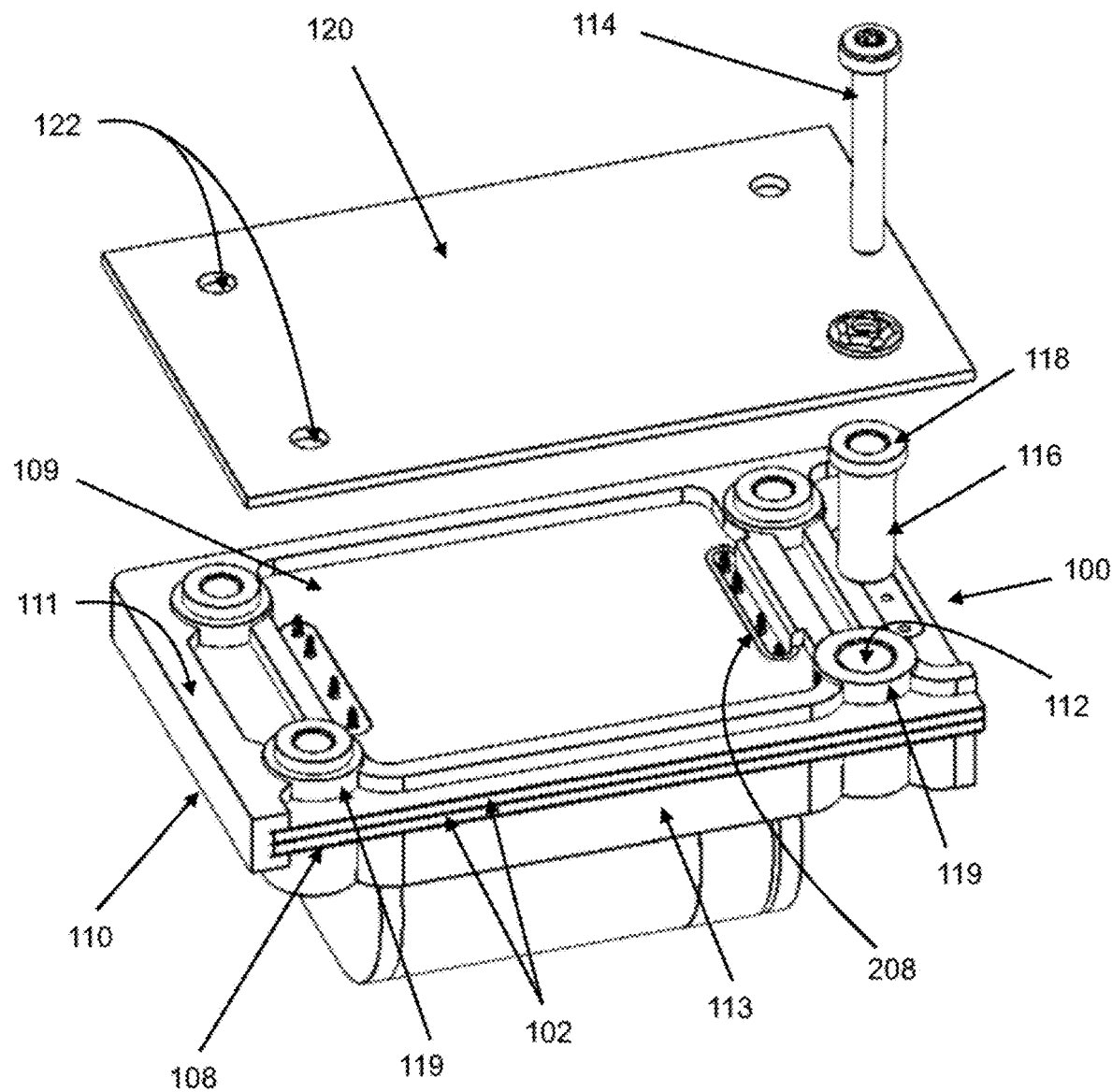
FIG. 1 shows a partially exploded view of an electrical assembly having a first bus board embodied in accordance with the present disclosure.

It should be noted that in the detailed descriptions that follow, identical components have the same reference numerals, regardless of whether they are shown in different embodiments of the present disclosure. It should also be noted that for purposes of clarity and conciseness, the drawings may not necessarily be to scale and certain features of the disclosure may be shown in somewhat schematic form.

Spatially relative terms, such as "top", "bottom", "lower", "above", "upper", and the like, are used herein merely for ease of description to describe one element or feature's relationship to another element(s) or feature(s) as they are illustrated in (a) drawing figure(s) being referred to. It will be understood that the spatially relative terms are not meant to be limiting and are intended to encompass different orientations of the device in use or operation in addition to the orientation depicted in the drawings.

As used herein, the term "electrical device" shall broadly mean any device that uses, generates, transforms or controls electricity and explicitly includes electronic devices and, in particular, semiconductive devices, as well as active and passive electronic devices. By way of example and without limitation, electrical devices include capacitors, resistors, inductors, transformers, thermistors, diodes, sensors, switches, transistors, rectifiers, IGBTs and batteries.

Referring now to FIG. 1, there is shown an electrical assembly that includes a multilayer bus board 100 embodied in accordance with the present disclosure. The multilayer bus board 100 includes a multilayer stacked assembly 108 (shown best in FIG. 2) which includes a plurality of conductive plate or layer structures 102 with a dielectric layer structure 104 disposed between adjacent conductive layer structures 102. For example, each conductive layer structure 102 may be provided as one or more layers of copper, which is highly conductive, or any other suitable highly conductive material. Dielectric layer structures 106 may optionally be disposed on either side of the outer conductive layer structures 102. Collectively, the conductive layer structures 102, dielectric layer structures 104 and the outer dielectric layer structures 106 (if present) form the multilayer stacked assembly 108.

The dielectric layer structures 104, 106 may be provided in the form of paper layers, polymeric films, e.g. thermoplastic films, ceramic woven fibers, cellulitic films, Nomex® or any other suitable dielectric sheet material having suitable dielectric properties for the application. By way of example, and not limitation, dielectric layer structures may be paper having a thickness in the range of 0.127 mm to 0.3 mm, recognizing that other thicknesses of the dielectric layer structures may be desirable based on the specific application and it may be desirable for certain dielectric layer structures to have different thicknesses and dielectric properties from other dielectric layer structures in the multilayer stacked assembly. The dielectric layer structures are distinct layers from adjacent conductive layer structures.

In some embodiments, each of the dielectric layer structures 104, 106 may be a single layer of a dielectric material. In other embodiments, however, the dielectric layer structure 104 and/or the dielectric layer structure 106 may each be comprised of a plurality of layers or plys, which may be formed from the same or different material. The dielectric layer structure 104 and/or the dielectric layer structure 106 may each be comprised of a plurality of plys selected to have different properties with regard to structure, adhesion, electrical insulation, thermal conductivity, weather resistance and/or melt-bondability. In one embodiment, the dielectric layer structures 106 may each be formed from a plurality of plys, wherein the innermost ply adjacent to the conductive layer structure 102 has good melt-bondability, while the outermost ply has good dielectric properties (e.g. a low dielectric constant). The innermost ply with good melt-bondability may be formed from ethylene-vinyl acetate (EVA), ethylene methyl acrylate (EMA), ethylene acrylic acid (EAA), ethylene methacryclic acid (EMAA) or a blend of any of the foregoing. The outermost ply with good dielectric properties may be formed from polypropylene, polyethylene, polystyrene, polyethylene terephthalate, polyimide, polyether ether ketone, polycarbonate or a fluoropolymer, such as polytetrafluoroethylene (PTFE) or fluorinated ethylene propylene (FEP).

In another embodiment, the dielectric layer structures 106 may each have an innermost ply adjacent to the conductive layer structure 102 that has very good dielectric properties, while the outermost ply has good thermal conductivity. The outermost plys may be formed from a binding resin that includes thermally conductive filler, such as aluminum oxide, aluminum nitride, silicon carbide, boron carbide or tungsten carbide. The binding resin may be an epoxy resin, a polyimide resin, a polyurethane resin or a silicone resin. Antioxidant and UV stabilizers may also be added to the binding resin to improve its weatherability. The innermost ply may be formed from the dielectric polymers described above, or the innermost ply may be formed from a binding resin filled with dielectric filler, such as PTFE particles. Thermally conductive filler may also be included in the binding resin of the innermost ply, but at a different (e.g. lower) loading.

In still another embodiment, the dielectric layer structures 106 may each have three plys: an innermost ply adjacent to the conductive layer structure 102 that has very good dielectric properties, a middle ply having good thermal conductivity and an outermost ply that has good weatherability. The innermost ply with the good dielectric properties may may have the construction described above with the other embodiments. The middle ply with the good thermal conductivity may have the construction described above for the outermost ply with good thermal conductivity in the previous embodiment. The outermost ply with good weatherability may be formed from polyethylene napthalate (PEN), polyvinylidene fluoride (PVDF), polyvinyl fluoride (PVF), or ethylene tetrafluoroethylene (ETFE). The polymer may also contain thermally conductive filler to improve its thermal conductivity.

As described above, the dielectric layer structures 104 may also each have multiple layers or plies. For example, a dielectric layer structure 104 may comprise a plurality of plies having good dielectric properties. Alternately, a layer structure 104 may include a middle ply comprising a flexible printed circuit that is disposed between a pair of outer plies having good dielectric properties. In this regard, one or more of the dielectric layer structures 106 may also have a three-layer structure that includes a middle ply comprising a flexible printed circuit that is disposed between a pair of outer plies having good dielectric properties.

Similar to the dielectric layer structures 104, 106, each of the conductive layer structures 102 may be a single layer of a conductive material, such as a plate or foil of copper. In other embodiments, however, the conductive layer structures 102 may each be comprised of a plurality of layers or plys, which may be formed from the same or different material. For example, a conductive layer structure 102 may comprise a thick layer of conductive metal adjoining a thin layer of conductive metal. The thin layer is provided to facilitate connection to an electrical device, while the thick layer is provided to carry the bulk of the current. An embodiment with this construction is described in more detail below. The thin layer may be composed of the same or different metal than the thick layer. For example, the thick and thin layers may each be composed of copper, or the thin layer may be composed of steel, while the thick layer may be composed of copper. A third layer may also be provided. This third layer may also be a thick layer and may, together with the other thick layer, sandwich the thin layer in-between. In this three-layer embodiment, the outer, thick layers may be composed of copper, while the inner, thin layer may be composed of steel. Alternately, all three layers may be composed of copper.

Figure 2:
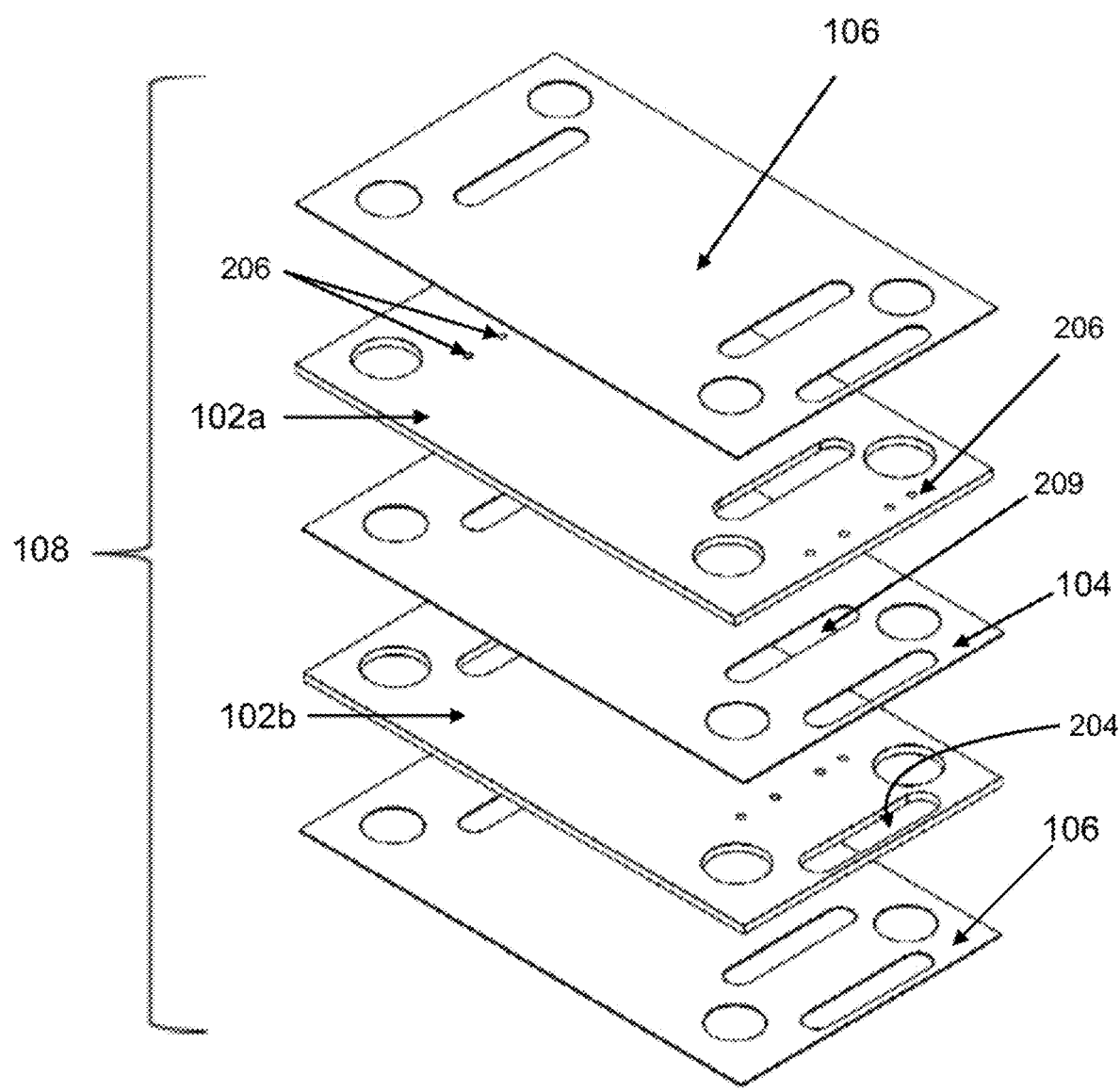
FIG. 2 shows a perspective view of a stacked assembly of the first bus board of FIG. 1.

An exemplary bus board 100 produced in accordance with the present disclosure, as shown in FIGS. 1 and 2, includes 2 conductive layers. It should be recognized however, that a bus board produced in accordance with the present disclosure may include 2, 3, 4 or more conductive layer structures 102 with dielectric layer structures 104 disposed therebetween.

Figure 3:
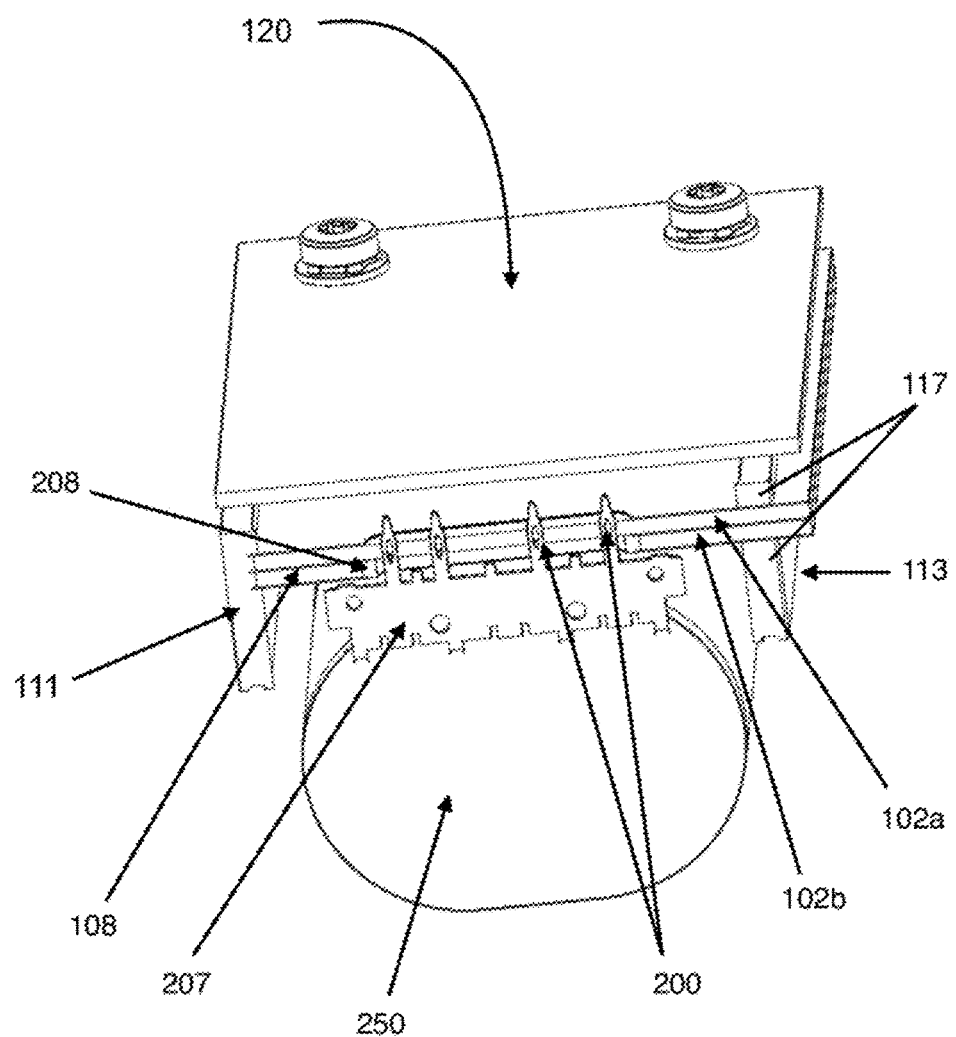
FIG. 3 shows a partial sectional view of a portion of the electrical assembly of FIG. 1.

Referring now to FIGS. 1 and 3, a molded frame 110 mechanically maintains the multilayer stacked assembly 108 and adjacent conductive layer structures 102 and the dielectric layer structures 104 and 106 in secure aligned stacked arrangement. The frame 110 may be molded of any suitable moldable or cured dielectric material, such as a thermoplastic, thermoset epoxy or other material that mechanically maintains the multilayer stacked assembly 108 in secure aligned arrangement. The frame 110 defines one or more enlarged openings 109 and includes a peripheral portion that may be formed from a plurality of outer structures 111 integrally joined together to form a particular configuration, such as a rectangular configuration. Since a portion of the bus board 100 is cut away in FIG. 1, only two of the four outer structures 111 are shown. An external surface of an outer one of the layer structures 102 or 106 is exposed through the one or more openings 109. The frame 110 may further include inner structures 113 that are integral with the frame 110 and are connected to the outer structures 111. The inner structures 113 help maintain the layer structures 102, 104 and 106 in a tightly stacked arrangement in areas away from the periphery of the assembly 108. Some inner structures 113 may extend parallel to the outer structures 111, while other inner structures 113 may extend perpendicular to outer structures 111. The inner structures 113 may alone, or together with the outer structures 111, delimit a plurality of device areas 115. Electrical devices may be mounted to the assembly 108 in the device areas 115, as described more fully below. One or more of the inner structures 113 may include opposing clamping members 117 between which the stacked assembly 108 extends. The clamping members 117 may press the stacked assembly 108 together like a vice or clamp. The inner structures 113 may also have standoffs 119 that join the inner structures 113 to the outer structures 111 and/or other inner structures 113. The standoffs 119 are cylindrical and have openings or bores 112 formed therein. At least one end of each standoff 119 projects outward farther than the rest of the frame 110. It is preferred that the frame 110 be formed (via molding) over the stacked assembly 108, however, in an aspect of the disclosure, the frame 110 can be premolded and then secured over the assembly 108 in a subsequent step.

Since the multilayer stacked assembly 108 is secured mechanically by the frame 110, there is no need for adhesives, lamination or bonding processes, as are employed in conventional laminated bus boards. Additionally, in the process of molding or setting the frame 110, the frame material adheres to the edges of the layer structures 102, 104, 106. Good adhesion of the plastic frame 110 to the dielectric layer structures 104, 106 provides beneficial insulation around the periphery of the conductive layers and thereby improves the creep distance at the edges of the assembly 108. The production of bus boards in the presently described manner is particularly suitable for high volume production processes. Additionally, the presently disclosed molded multilayer bus board may utilize very thin dielectric sheets or films so as to permit conductive layers to be stacked in close proximity while maintaining electrical isolation there between. More specifically, closely spaced current paths or planes of opposed layers separated by a thin dielectric and wider current paths result in a lower inductance, faster switching speeds and more rapid heat dissipation. Such a construction improves electrical efficiency in high speed electrical circuits, e.g. high speed switching circuits as employed in inverters, switching power supplies, etc.

Electrical connections may be made to respective conductive layer structures 102 of the assembly via the use of conductive press fit pin, high normal force connectors or any other suitable conductive terminal (hereinafter "conductive contact") that is urged through openings in the multilayer stacked assembly 108 as shown in FIG. 3. If it is desired to have a conductive contact 200 pass through one or more conductive layers 102 and conductively interconnect with a selected conductive layer 102a, while not making an electrical connection with another layer 102b, an over-sized opening 204 is provided in the layer 102b through which the conductive contact 200 is to pass without making an electrical interconnection. A smaller contact receiving opening 206 is provided in a conductive layer 102a that is sized for a press-fit electrical interconnection with the conductive contact 200. More specifically, the contact receiving opening 206 is sized so that the conductive contact 200 abuts the walls of the contact receiving opening 206 and thereby electrically interconnects the conductive contact 200 to the respective conductive layer 102a when the conductive contact 200 is urged through the multilayer stacked assembly 108. As shown, a plurality of press-fit contacts 200 of a connection plate 207 may extend through the over-sized opening 204 and may be snugly disposed in a plurality of the smaller openings 206.

The frame 110 of a dielectric material is molded or set around the periphery of the bus board 100. When molding the frame 110, insulating sleeves 208 may be formed as an integral part of the molded frame 110 within the oversized openings 204 so as to prevent the conductive contacts 200 from making electrical contact with layer 102b (FIG. 3). The sleeves 208 are molded as a one-piece integral part of the frame 110. Depending on the location of a sleeve 208, the sleeve may connect to the peripheral portion of the frame via inner structures 113 extending from the peripheral portion of the frame 110. The sleeves 208 may be elliptical, configured to surround elongated slots as illustrated, or may be of any other desired shape to accommodate desired configurations of conductive contacts 200 while insulating the contacts 200 from the applicable conductive layer.

A sleeve 208 may be positioned inward from either side of the multilayer stacked assembly 108, depending on the location of the conductive layer structure 102 that is being insulated by the sleeve 208. Additionally, it should be appreciated that oversized openings may be provided in a plurality of conductive layer structures 102 and dielectric layer structures 104, 106 to accommodate a sleeve 208, i.e., a sleeve 208 may extend through a plurality of conductive layer structures 102 and dielectric layer structures 104, 106. In this way, a sleeve 208 may insulate a plurality of conductive layers 102 from a conductive contact 200. As shown in FIG. 2, the dielectric layer 104 that is disposed between the conductive layer 102a (which makes electrical contact with the conductive contact 200) and the conductive layer 102b (which is insulated from the conductive contact 200 by the sleeve 208) includes an oversized opening 209 to accommodate the sleeve 208.

The bores 112 in the standoffs 119 of the frame 110 are configured to receive bushings 116 for fasteners 114, which may be used to mount a cover or circuit board 120 over the bus board 100. The fasteners 114 may be secured to a structure disposed below the bus board 100 or to the frame 110, depending upon the application.

As shown in FIG. 1, the bushings 116, which are illustrated as generally cylindrical bushings having a cylindrical flange 118 at one end, are insertable into the bores 112. Alternatively, the bushings 116 may be insert molded during the molding process. The bushings 116 may be metal or any other suitable material to avoid stressing the bus board 100 upon tightening of the fasteners 114. Fasteners 114 may be disposed through openings 122 in the cover or circuit board 120 and through the bushings 116. The height of the flange 118 (in conjunction with the height of the standoff 119) is specified so as to provide sufficient spacing between the cover or circuit board 120 and the adjacent surface of the multilayer stacked assembly 108 to accommodate tails of conductive contacts 200 that extend through the upper surface of the stacked layer assembly 108. Additionally, when a circuit board is mounted adjacent the bus board, the spacing between the bus board and the circuit board must be sufficient to prevent arcing between tails of conductive contacts traces, conductors on the circuit board or components mounted thereto. Upper peripheries of the bores 112, upper portions of the flanges 118 of bushings 116 and/or lower peripheries of the bushings 116 may optionally be formed to have concave seats (not shown) to accommodate elastomeric O-rings so as to provide vibration and stress relief for the bus board 100 following mounting of the same.

While the above-described assembly has been discussed with respect to the interconnection of a single conductive structure (connection plate 207) with a conductive layer in which the conductive structure is insulated from one or more other conductive layers via molded sleeves formed in the molding of the frame 110, a plurality of conductive structures may similarly be conductively connected to conductive traces or planes of one or more layers while being insulated from conductive traces or planes on one or more other layers via the use of insulated sleeves formed in the process of the molding of the frame 110. The use of molded features which are components of the molded leadframe to create insulated pass through holes into adjacent layers is a design benefit of the present invention. The molded multilayer bus board 100 also allows for additional layer stacking beyond two layers as desired and needed, whereas lamination is restrictive of layer number due to process timing to activate adhesion in the lamination process.

Figure 4:
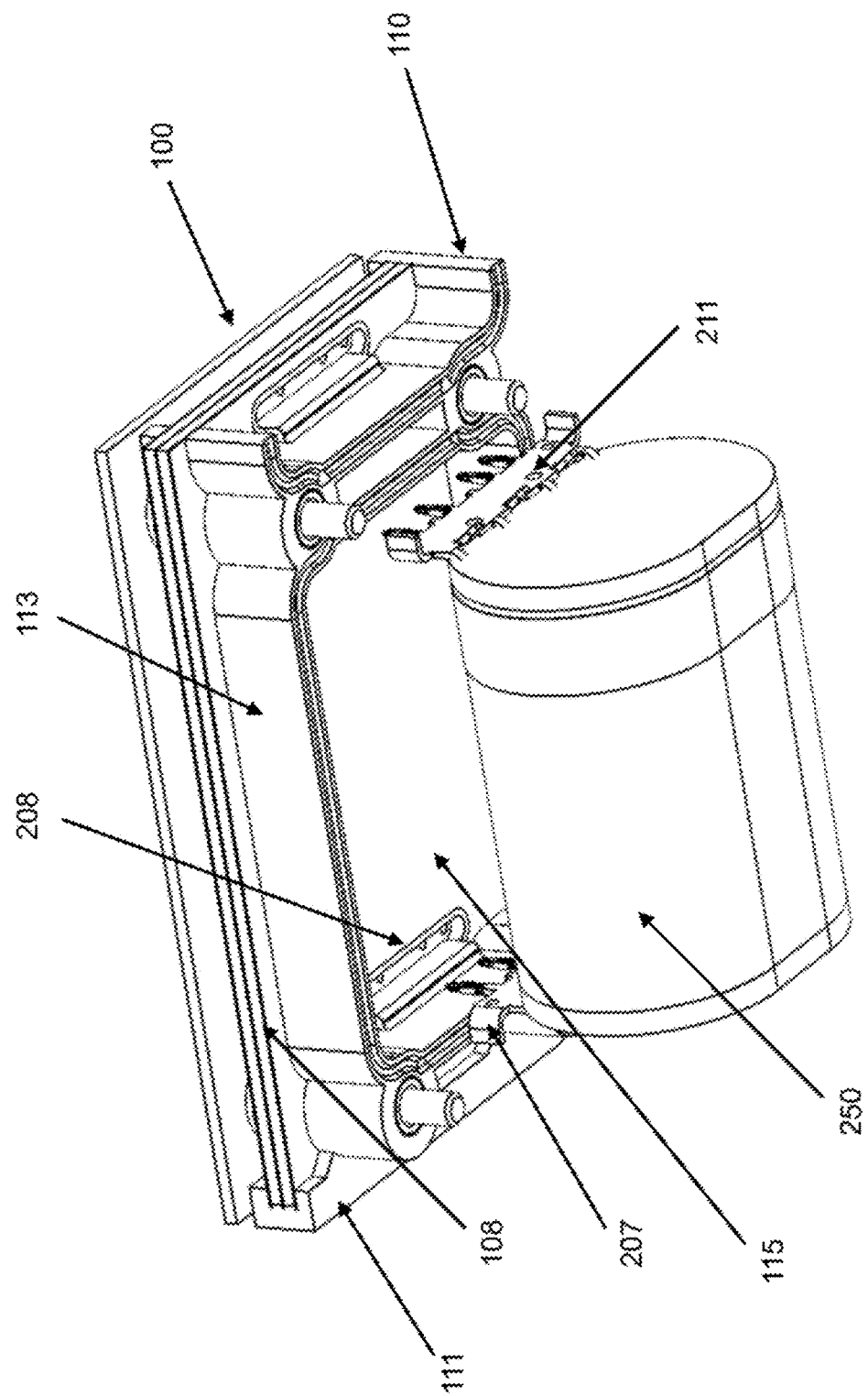
FIG. 4 shows a bottom perspective view of the electrical assembly of FIG. 1, with an electrical device partially removed from its mounting to the first bus board.

As best shown in FIGS. 3 and 4, an electrical device 250, which may be a capacitor, is mounted to the assembly 108 in a device area 115. As described above, one end of the electrical device 250 is electrically connected to the conductive layer 102*a* by the press-fit terminals 200 of the connection plate 207. The other end of the electrical device 250 is electrically connected to the conductive layer 102*b* by the press-fit terminals 200 of a second connection plate 211. Both of the connection plates 207, 211 are fixed to the electrical device 250. The press-fit terminals 200 of the connection plates 207, 211 are secured within holes 206 in the conductive layers 102*a*, 102*b*, thereby securing the electrical device 250 to the multilayer bus board 100, within the device area 115.

Some of the benefits of the present invention include significant cost reduction, improved mechanical and electrical performance. The quick insert mold cycle time relative the long lamination time is a cost and time saver. The costly PEN/epoxy film can be replaced with a relatively common, low-cost Nomex™ or similar insulator. The threaded inserts and rubber washers can be eliminated. In addition, much greater bolting forces can be used on the bus board with less shrinkage error and smaller stacked heights and sizes. For fast switching circuits like IGBTs, stray inductance in bus board circuits can cause overvoltage which adversely affects switching speeds. Finally, as mentioned the thin insulator allows for conductive layers that are stacked in relatively close proximity, as small as 0.127 mm, and usually equal to or less than 0.3 mm, and often equal to or less than 0.2 mm, to each other which maintaining electrical insulation which improves electrical efficiency.

Figure 5C:
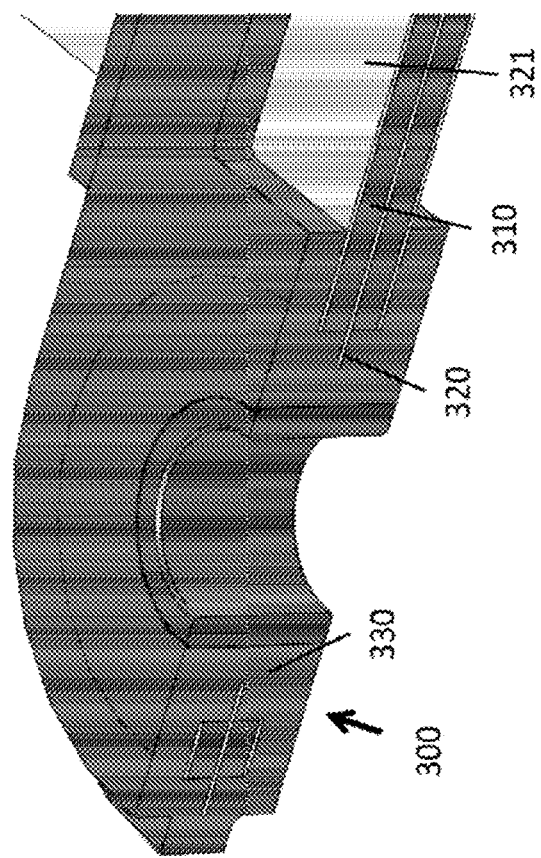
FIG. 5C is a sectional view of the bus board of FIG. 5A.
Figure 5B:
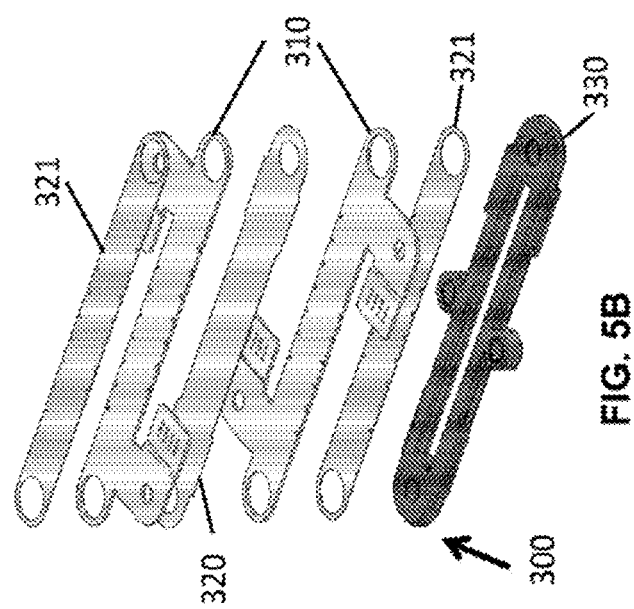
FIG. 5B is an exploded view of the bus board of FIG. 5A.
Figure 5A:
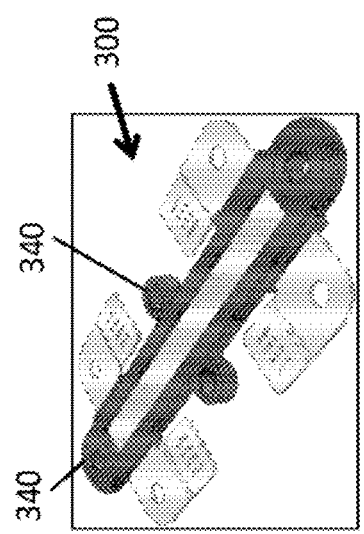
FIG. 5A is a perspective view of a second bus board embodied in accordance with the present disclosure.

Referring now to FIGS. 5A, 5B, and 5C, there is shown three descriptive images of the inventive multilayer bus board 300. Multilayer bus board 300 comprises three basic components which adds to simplicity and which reduces cost: the two conductive sheets 310 which can be stamped or otherwise formed, and in one embodiment comprised of copper such as 1 mm thick C11H02 copper sheet or other conductive material, and electrolytically post plated (tin over nickel) to reduce environmental corrosion. The dielectric layer 320 disposed and interposed between the conductive sheets 310, can be comprised of thin insulative paper which can be cut into the desired shape. End dielectric layer structures 321 can also be included to insulate the outer surfaces of the conductive sheets 310. The multilayer conductive-dielectric is secured by an overmold 330 which can comprise an insulative thermoplastic such as polyphthalamide (PolyOne PPA35GF) or other resin. Although the overmolded frame 330 is shown as being a separate formed component in the exploded view of FIG. 5B, it is preferably formed over the multilayer stacked assembly via a conventional plastic molding operation (melt temperature 325° C., and mold temperature 90° C.). The overmold adheres to the dielectric layers, providing additional thermal and vibration shock resistance. The overmold can also provide multiple openings 340 for securing the multilayer bus board to other components or other fixtures. The multilayer bus board 300 provides a design that does not require edge crimps (as will be described in more detail below) or secondary epoxy filling for creep requirements. The plastic, although thermoplastic in this example, is not limited as long as the material meets the dielectric requirements of an insulator and the mechanical requirements set forth in this application. Thermoset materials can be used and may be preferred as temperatures requirements rise. Higher temperature thermoplastics like liquid crystal polymers (LCPs) or Polyether ether ketone (PEEKs) may be preferred if temperature demand require their associated temperature resistance. The overmold frame 330 encapsulates the conductive layers and the dielectric layers including the portions of each dielectric layer which extends outward past the adjacent edge of each conductive layer. Typical operational voltage is about 450V to 600V. However, design alternatives described herein can withstand voltages as high as 4,000V.

Figure 6A:
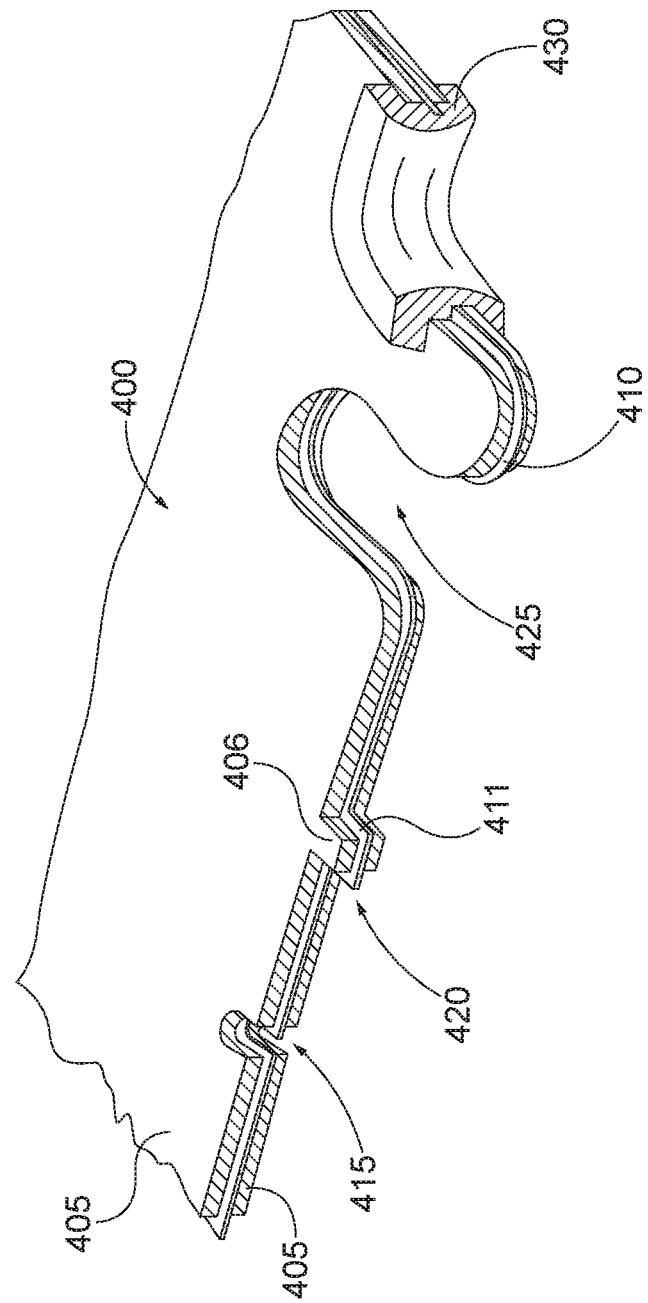
FIG. 6A shows an edge portion of a third bus board embodied in accordance with the present disclosure.
Figure 6B:
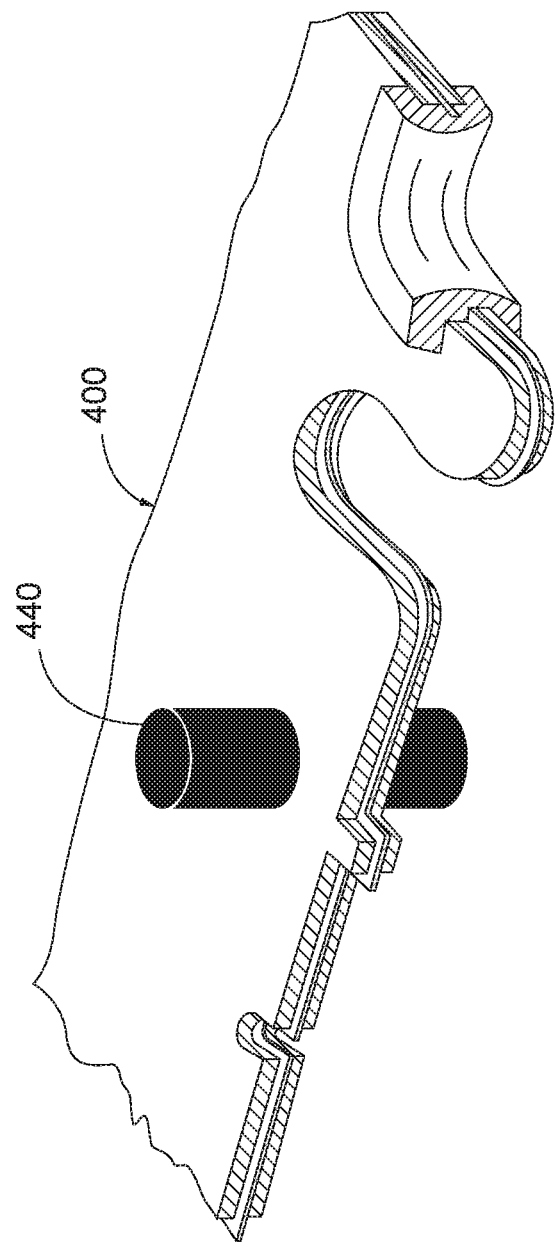
FIG. 6B shows an edge portion of the third bus board with an additional plastic holding feature.

Referring now to FIGS. 6A and 6B there is shown a portion of a multilayer bus board 400 with two parallel extending conductive sheets 405, which are separated by an interposed dielectric sheet 410, which includes an end portion 411 extending outwards from the adjacent conductive sheets 405 and past the end portion 406 of the conductive sheets. The end portions 411 and 406 are disposed in parallel arrangement with the dielectric end portion 411 always extending outwards from the conductive sheet end portion 406. A molded plastic edge 430 of the overmold (not shown) extends over both conductive sheet end portions 406 and the dielectric end portion 411. In the process of molding the overmold frame which includes the molded plastic edge, the resin of the overmold frame is heated so that the thermoplastic can be molded to the desired shape. The conductive sheets, dielectric sheets, and the overmold frame expand and contract according to their coefficient of thermal expansion ("CTE"). The different CTE of each multilayer bus board component can result in "CTE mismatch" during heating and cooling of the multilayer bus board during operation of the multilayer bus board.

The multilayer bus board 400 can be designed to reduce the stresses caused by CTE by the inclusion of edge undulations such as mousebites 415, which are relatively small occlusions in the edges of both conductive sheets 405 and the interposed dielectric sheet 410, crenellations 420 which can be small in size but which extend outward from the multilayer bus board 400 and which generally are shaped with right angles, and large undulations 425 which are generally arcuately shaped and can comprise portions of the multilayer bus board which extend inwards or outwards relative the body of the multilayer bus board. Generally, for purposes of description herein, the large undulations, crenellations and mousebites are referred to as edge undulations.

The molded plastic edge 430 can either follow the edge surface of an edge undulation such as a large undulation, or fill in and cover an edge undulation such as a relatively smaller mousebite or crenellation. However, all edge undulations act to relieve CTE mismatch related stress that can otherwise result in cracking of conductive sheet edge portions 406.

FIG. 6B shows the multilayer bus board 400 of FIG. 6A, but also includes a plastic feature interposed and extending through the multilayer bus board 400 to hold the multilayer bus board together and to eliminate the need for the overmold, or the need for the overmold to completely mechanically hold together the multilayer bus board. The plastic feature can comprise the same resin as the overmold or can be formed from another material. The size, location and material the plastic feature is made from depends on the multilayer bus board design, and what force is required to hold the multilayer bus board together. Topography, as will be detailed below, can be included in each plastic feature so as the locate components onto the multilayer bus board 400.

Figure 7A:
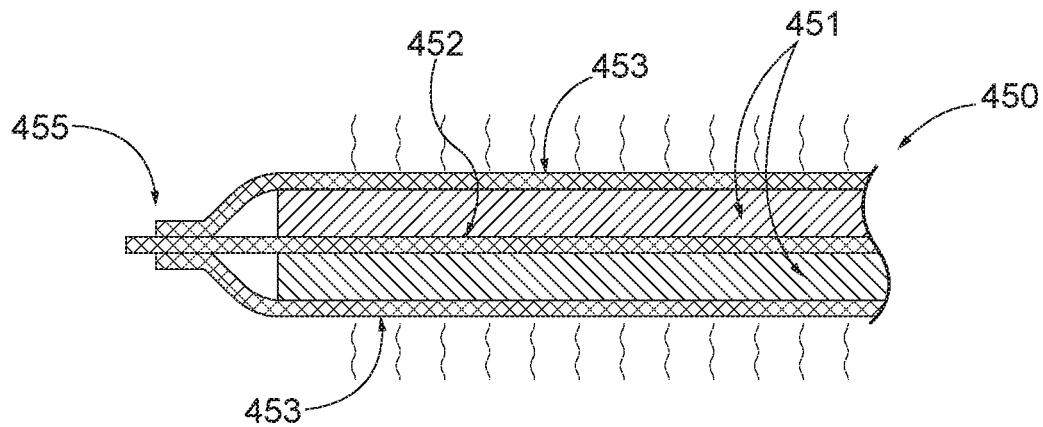
FIG. 7A shows a sectional view of a portion of a prior art bus board with a crimped edge.
Figure 7B:
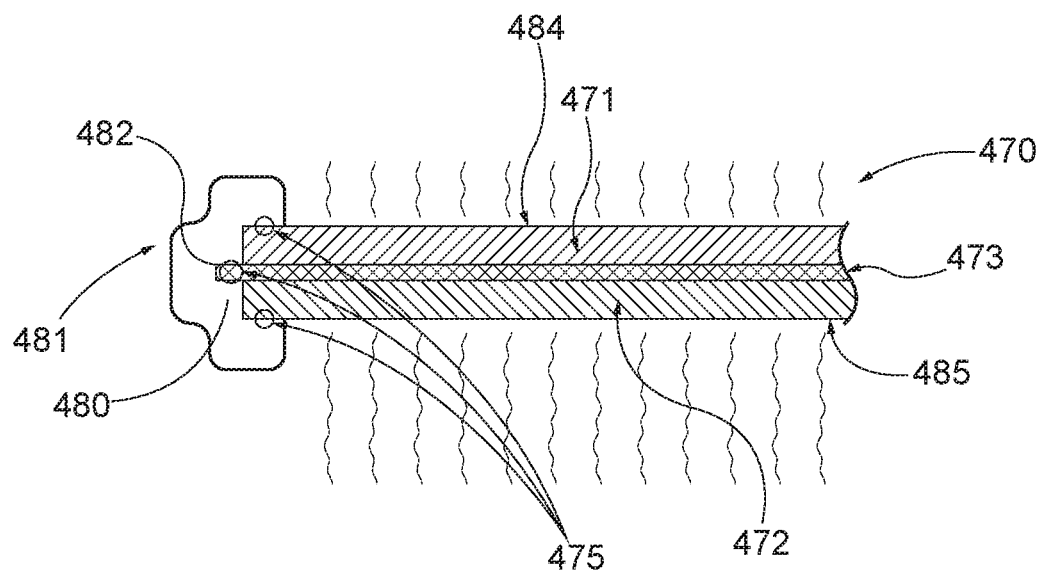
FIG. 7B shows a sectional view of a portion of a fourth bus board embodied in accordance with the present disclosure.

Referring now to FIGS. 7A and 7B, there is shown both a cross-sectional view of a prior art multilayer bus board 450 (FIG. 7A) and an embodiment of the multilayer bus board 470 of the present invention (FIG. 7B). The prior art multilayer bus board 450 comprises two copper sheets 451 with an interposed dielectric layer 452 and two outer dielectric layer structures 453. In FIG. 7A, the edges of the three dielectric layer structures are shown in a crimped arrangement at 455. The crimped arrangement requires additional width for the prior art multilayer bus board 450, and the two outer dielectric layer structures 453 insulate relative heat transfer as well as electricity transfer. Therefore, they impede heat dissipation which can negatively affect the multilayer bus board 450.

The multilayer bus board 470 of the present invention is shown in FIG. 7B with two conductive sheets 471 and 472 with an interposed dielectric sheet 473. Multilayer bus board 470 does not include any outer dielectric layers, and instead the outer surfaces 484 and 485 of the conductive sheets 471 and 472 respectively are not insulated and can more freely dissipate heat conducted through the conductive sheets 471 and 472. Outer surface 485 is scalloped or roughened to increase its surface area for heat conduction with the surrounding environment, which increases its ability to increase heat transfer and thus dissipate heat at a higher rate. In one aspect, the outer surface 485 can also be coated with a carbon which can be plasma sprayed or otherwise applied to also increase the ability of outer surface 485 to increase surface emissivity and thus increase heat dissipation through heat radiation.

The end 481 of the multilayer bus board 470 shows a molded plastic edge 480 surrounding the edge of both conductive sheets 471 and 472 and the dielectric sheet 473. The molded plastic edge 480 encapsulates the edge portion 482 of the dielectric sheet 473. The molded plastic edge 480 reduces the package width of the multilayer bus board 470 relative multilayer bus board 450, which is an advantage of the present invention relative the prior art.

Although the molded plastic edge encapsulates and secures the end of the multilayer bus board 470, its adhesion to the end surfaces 475 of the conductive sheets 471 and 472 and the dielectric sheet 473 can be improved by surface treatment of the end surfaces with an adhesive such as a silanes. Such adhesive treatment is known to enhance polymer metal adhesion in injection molding operations. An example of such an adhesive is a silane such as diaminofunctional silane which can act as a coupling agent between the metal conductive sheets 471 and 472 and the polymer of the molded plastic edge 480, but should in no way be limiting as other adhesives known to those skilled in the art which show utility in promoting adhesion can be also alternatively included.

Figure 8:
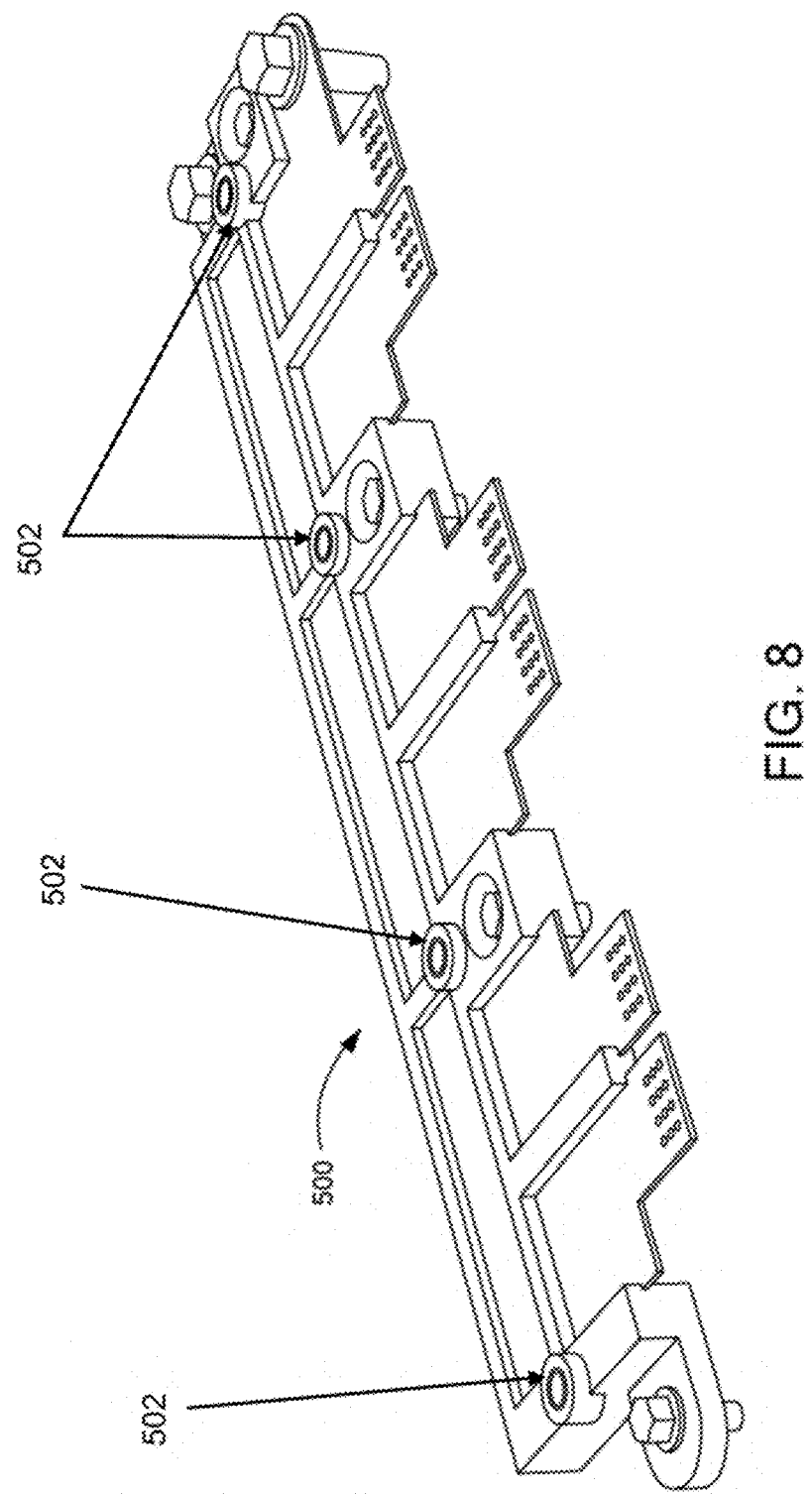
FIG. 8 shows a perspective view of a fifth bus board embodied in accordance with the present disclosure, wherein the fifth bus bar has a molded frame with topographical features.

Referring to FIG. 8, there is shown a portion of an overmolded multilayer bus board 500 of the present disclosure, which includes topography and molded features. Such topography extends in three dimensions and includes integrated features such as standoffs 502, locating features, bolt to features and edge definements which are secondary add-on features in prior art laminated bus boards, are described here as topography features of the overmold of the multilayer bus board 500 of the present disclosure. Such topography allows for locating, nesting and mounting of subassemblies and components to the multilayer bus board 500. The topography is molded as a portion of the overmold and can extend therefrom.

Figure 9:
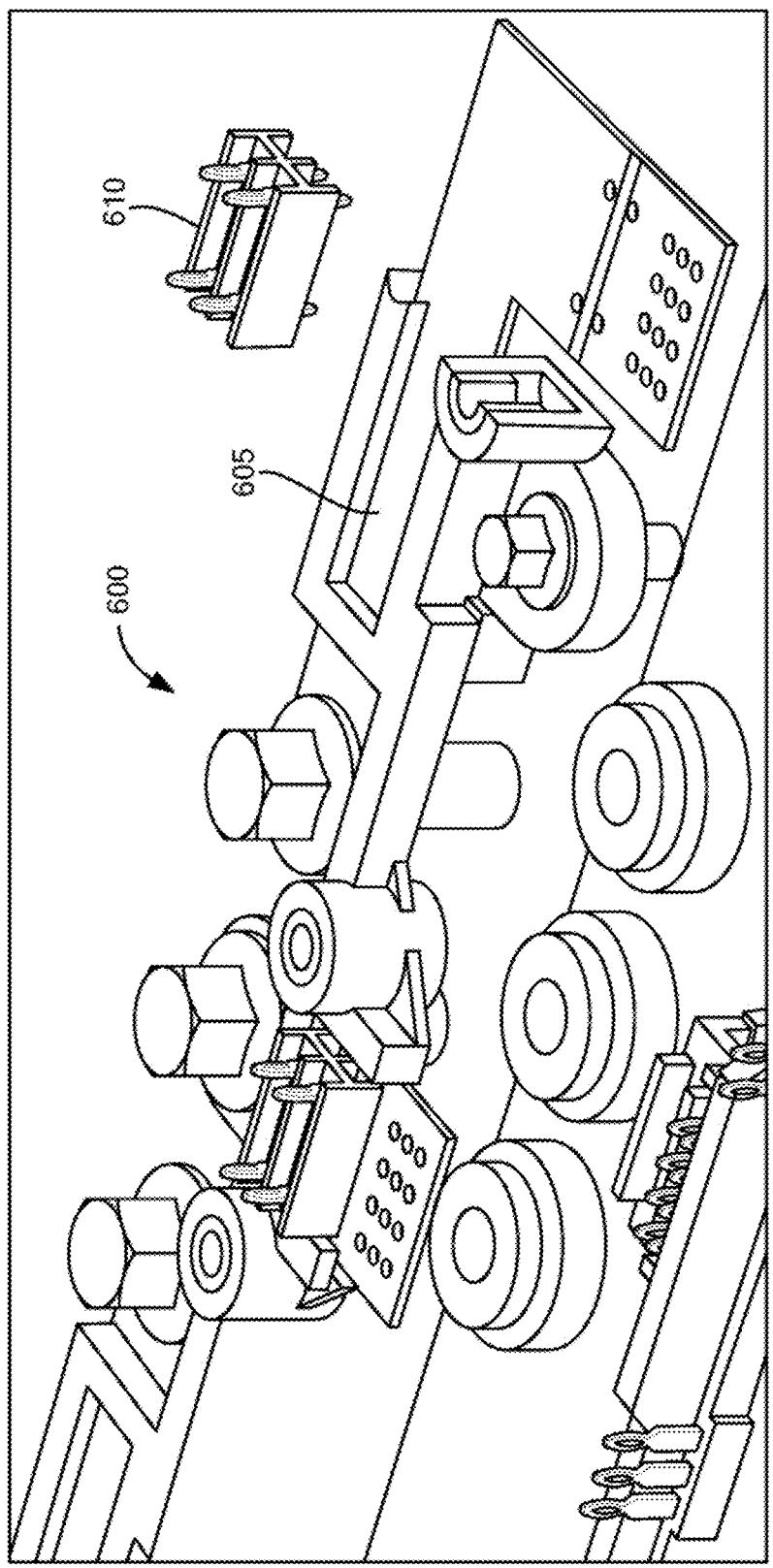
FIG. 9 shows a perspective view of a portion of a sixth bus board embodied in accordance with the present disclosure, wherein the sixth bus bar has a molded frame with topographical features for mounting integrated electrical components.
Figure 10:
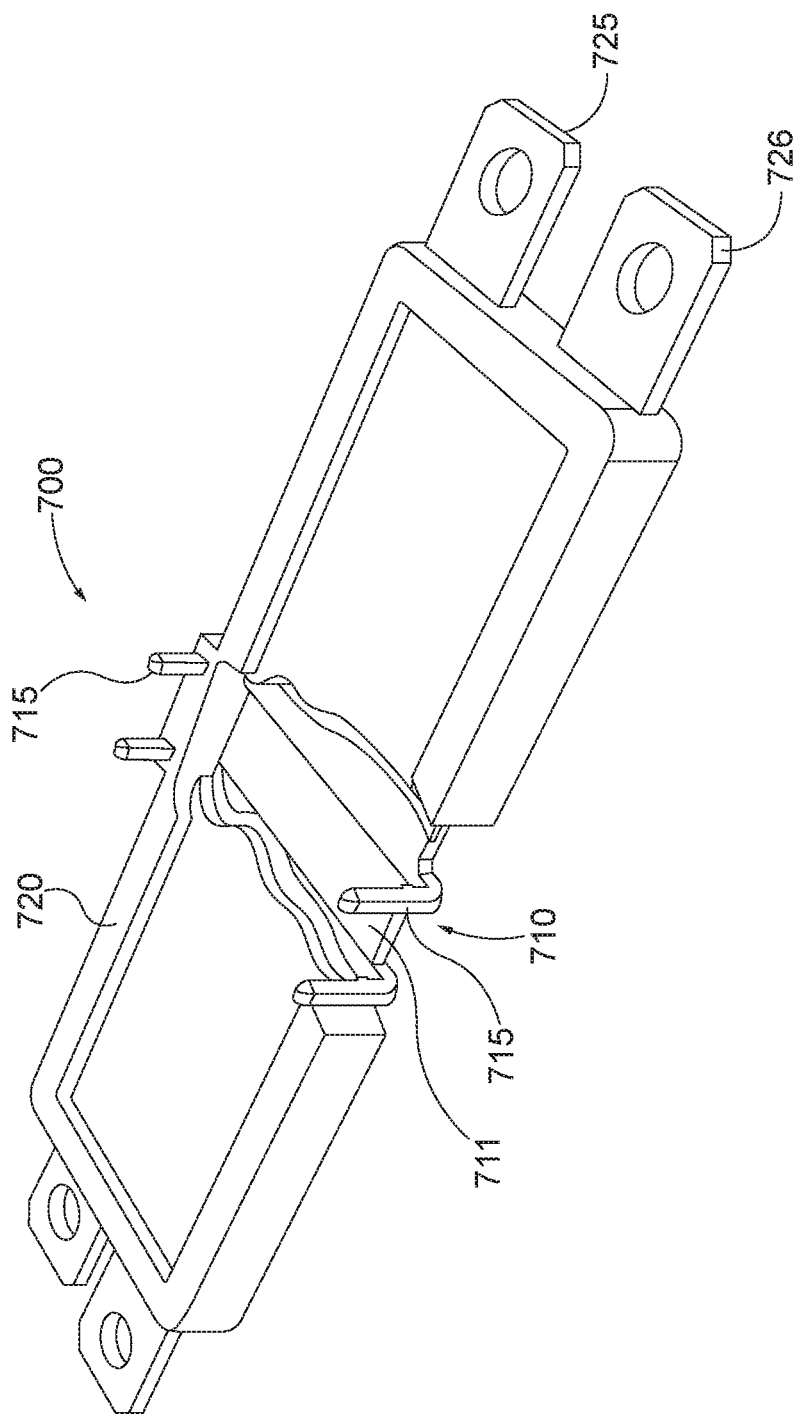
FIG. 10 shows a perspective view of an electrical assembly having a seventh bus board embodied in accordance with the present disclosure, wherein a portion of the seventh bus bar is cut away to show an integrated electrical component.

The described topography of the dielectric overmold can accommodate the integration of subcomponents directly into the multilayer bus board. Referring to FIG. 9, there is shown a multilayer bus board 600 having a frame with molded topography, including a hole 605 for the location and electrical integration of an integrated current sensor 610. Although the electrical integration of a current sensor is also shown in FIG. 10, the mechanical arrangement of the multilayer bus board 600 allows for the location and integration of a plurality of other desired subcomponents onto the multilayer bus board. This illustrative example should in no way be considered limiting and subcomponents can include any useful electrical components such as thermistors, diodes, resistors, capacitors, etc.

Referring to FIG. 10, there is shown a multilayer bus board 700 with a portion cut-away to display an integrated current sensor component 710. The current sensor 710 includes a resistive metal strip 711 which possesses a known resistance, which is placed in series with the load of the multilayer bus board 700. The voltage drop, which can be measured across pins 715 which are electrically connected across the resistive metal 711, is proportional to the current flow through the multilayer bus board 700. The pins can be connected to a programmable circuit board ("PCB") for monitoring the voltage change. The multilayer bus board 700 includes an overmold frame 720 which has appropriate penetrations for terminals 725 and 726 which extend from and are in electrical communication with conducting sheets (not shown) within the multilayer bus board 700.

Figure 11:
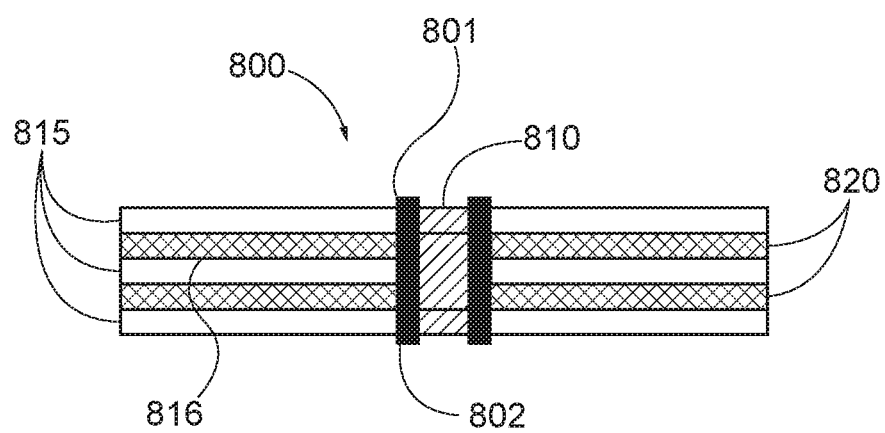
FIG. 11 shows a sectional view of an electrical assembly having an eighth bus board embodied in accordance with the present disclosure, wherein an integrated electric component is mounted within a dielectric sleeve disposed in a hole in the eighth bus board.

Referring to FIG. 11, there is shown a generic integrated electrical component 810, mounted within a hole 801 formed within a multilayer bus board 800. The hole is insulated by a molded dielectric sleeve 802, which is a portion of and extension of the overmold frame (not shown). The conductive bus bar layers or sheets 815 are separated from each other by alternating and interposed dielectric sheets 820. The conductive sheets include a center bus 816, which is insulated from the component 810 in the hole 801 by the molded dielectric insulator 802 which also locates and secures the component within the hole. The mounting and embedding of an electrical component into the hole 801 is simplified by the design of the multilayer bus board and these holes can act to integrate live components onto the bus, thus moving all inductance to the bus board, leaving data components for the PCB.

Figure 12:
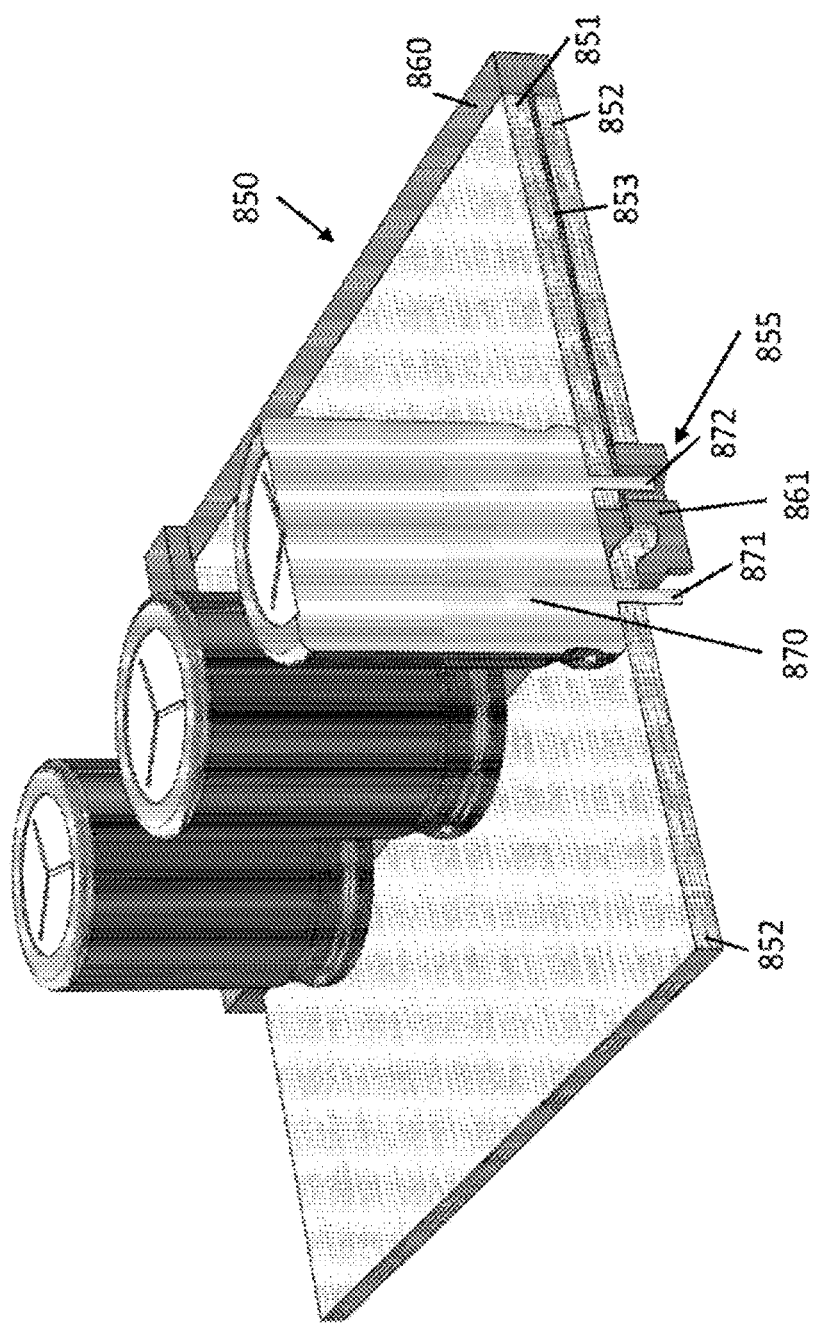
FIG. 12 shows a partial sectional view of an electrical assembly having a ninth bus board embodied in accordance with the present disclosure, wherein a plurality of electrical components are mounted to the ninth bus board.

Referring to FIG. 12, there is shown an integrated electrical component 870, mounted within a hole 855 formed within a multilayer bus board 850. The hole is insulated by a molded dielectric insulator 861, which is a portion of the overmold frame 860. The conductive bus bar layers or sheets 851 and 852 are separated from each other by interposed dielectric sheet 853. The component 870 has a first lead 871 which makes conductive contact with conductive sheet 852, but which is insulated from conductive sheet 851 by the molded dielectric insulator 861. A second lead 872 makes conductive contact with conductive sheet 851 but is similarly insulated from conductive sheet 852 by the molded dielectric insulator 861. Thus, the hole 855 allows for the location and integration of an electrical component onto the multilayer bus board 850 of the present disclosure. The hole accommodates the mounting of multiple components, and facilitates the electrical communication of the leads of each component with two different layers of the multilayer bus board 850.

Figure 13:
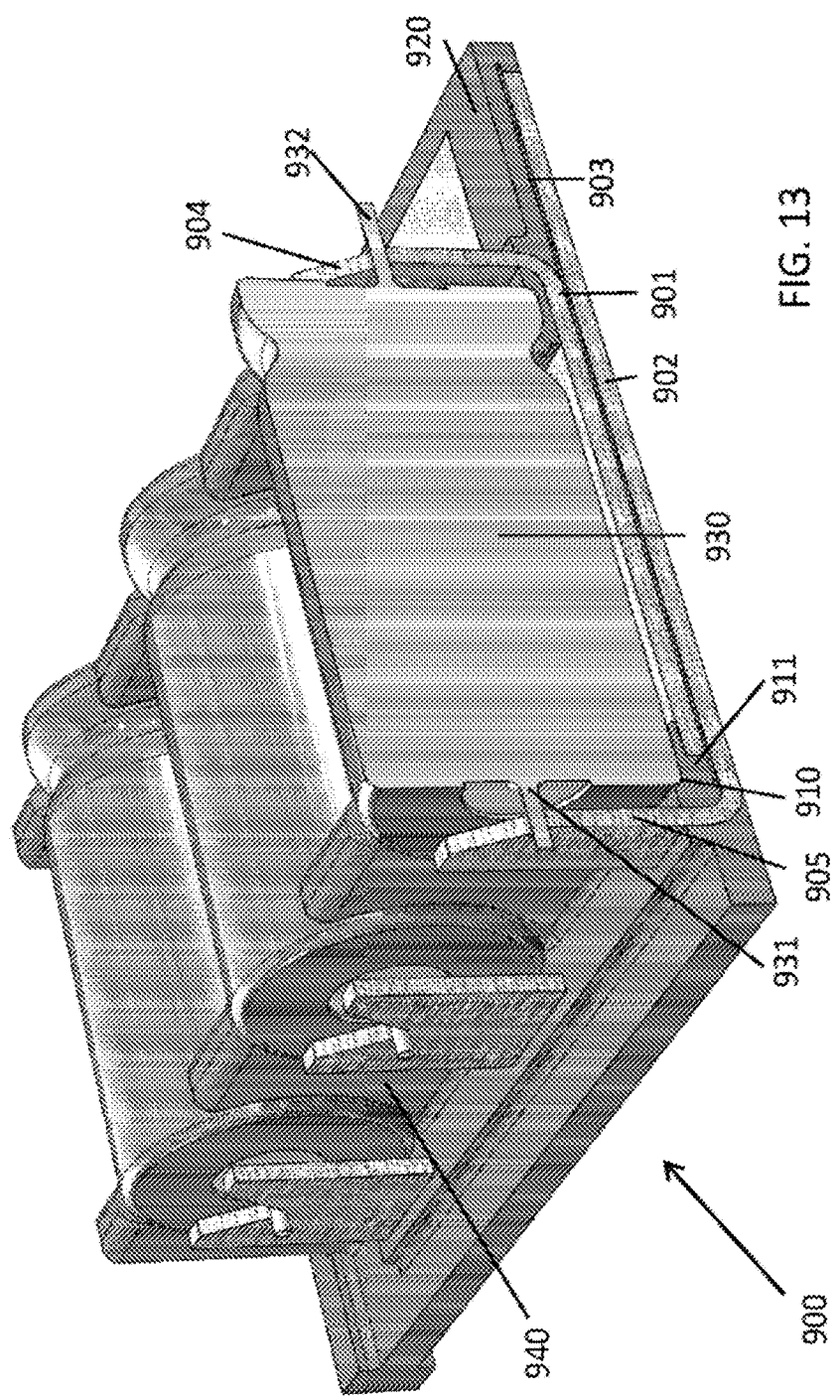
FIG. 13 shows a partial sectional view of an electrical assembly having a tenth bus board embodied in accordance with the present disclosure, wherein a plurality of electrical components are mounted to the tenth bus board.

Referring to FIG. 13, there is shown an integrated electrical component 930, mounted within a hole 910 formed within a multilayer bus board 900. The hole 910 is insulated by a molded dielectric insulator 911, which is a portion of the overmold frame 920. The conductive bus bar layers or sheets 901 and 902 are separated from each other by interposed dielectric sheet 903. The component 930 has a first lead 931 which makes conductive contact with conductive sheet 902 via an outwardly extending lead 905. A second lead 904 is electrically connected to outwardly extending lead 904 which is in electrical connection with conductive sheet 901. The hole 910 also includes locating topography 940 which is also an extension and portion of the overmold frame 920 to act as a locator and holder of the integrated components. Although the leads are show as in spring contact, alternative electrical communication means such as a weld, rivet, adhesive or other secure connection allows integration of an electrical component onto the multilayer bus board 900 of the present invention.

Figure 14:
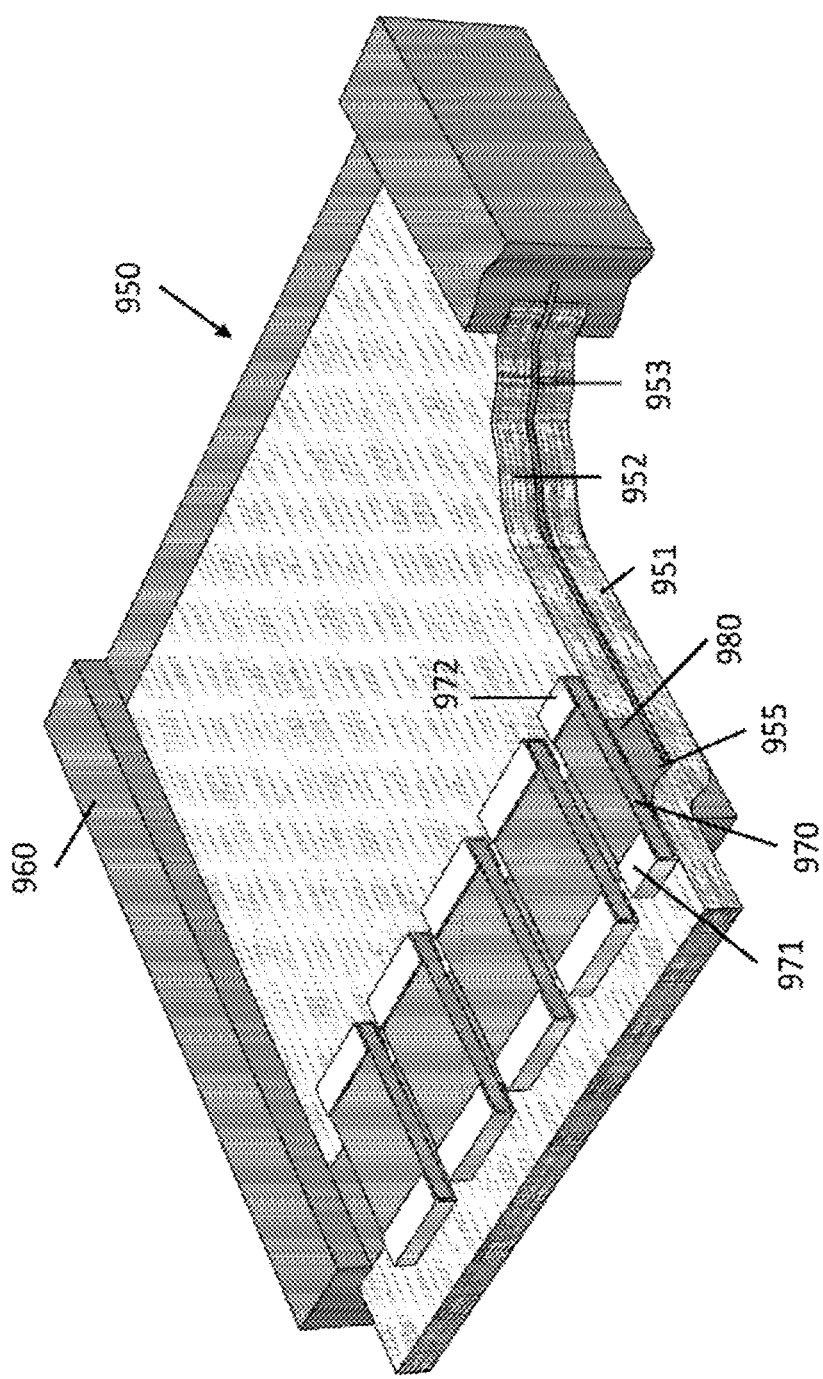
FIG. 14 shows a perspective view of an electrical assembly having an eleventh bus board embodied in accordance with the present disclosure, wherein a portion of the eleventh bus board is cut away to show an integrated electrical component.

Referring to FIG. 14, there is shown a multilayer bus board 950 with a portion cut-away to display an integrated channel 980, with multiple electrical components 970 mounted thereon. In this embodiment, the multilayer bus board 950 includes a first and second conductive sheet 951 and 952, with an interposed dielectric sheet 953 extending therebetween. The channel 980 is arranged for accommodation of surface mounted components, and dielectric layer 955 extends across the hole as a portion and extension of the overmold frame 960. The dielectric layer 955 cooperates with the dielectric sheet 953 to electrically insulate conductive sheet 951 from conductive sheet 952. The component 970 includes both a first and second lead 971 and 972 which are disposed at each end of the component. The first lead 971 making electrical connection with conductive sheet 951 and the second lead 972 making electrical connection with conductive sheet 952. Thus the molded dielectric 955 and 960 can accommodate the integration of subcomponents directly into the multilayer bus board 950. In this embodiment the component is mounted into the surface of the multilayer bus board 950, with each lead of the component mounted and connected to a separate conductive layer of the multilayer bus board 950.

Figure 15:
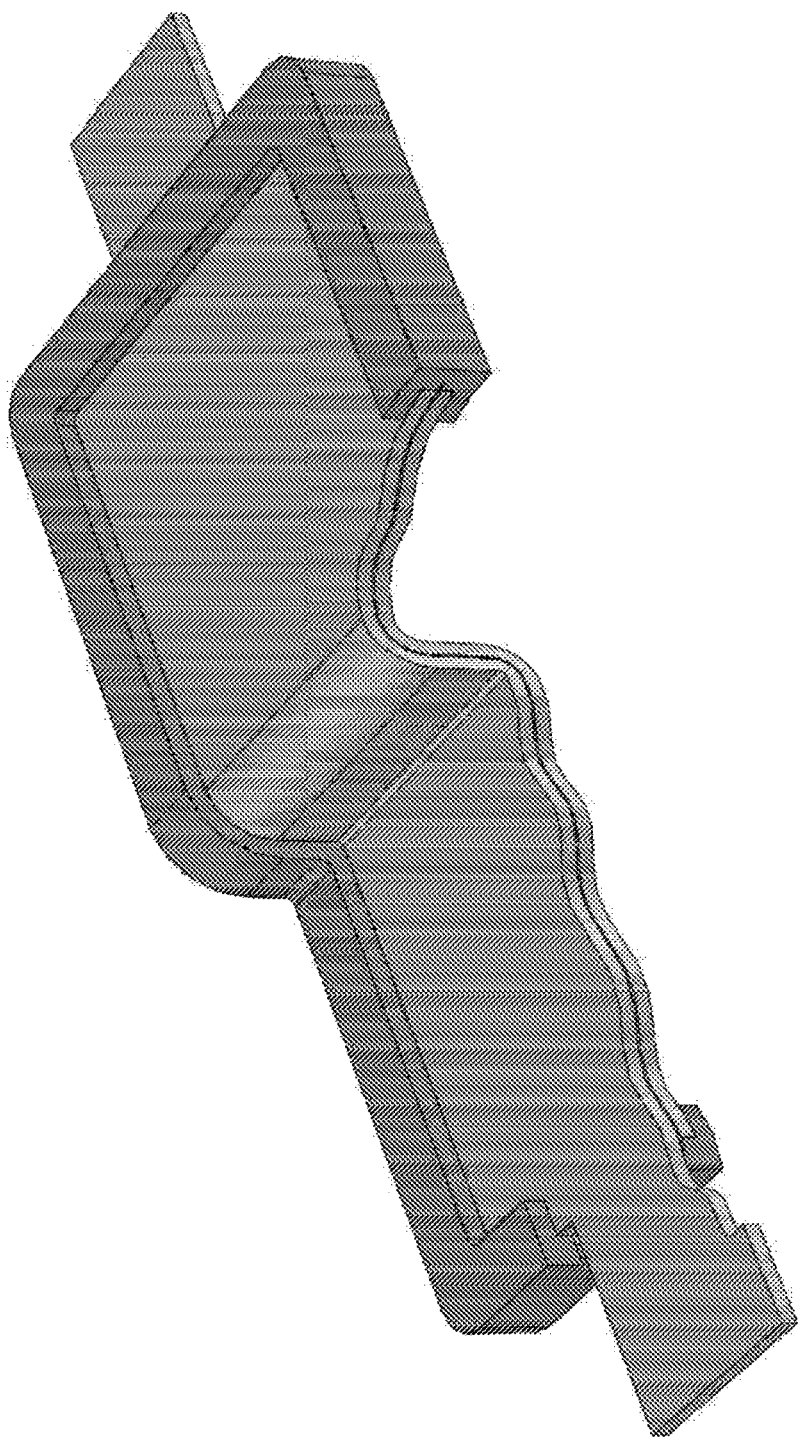
FIG. 15 shows a perspective view of a twelfth bus board embodied in accordance with the present disclosure, wherein a portion of the twelfth bus board is cut away.

A bus board in accordance with the present disclosure may also be provided as a folded and/or curved bus board which may be advantageous in various packaging applications. An exemplary embodiment that is both folded and curved is illustrated in FIG. 15. Various degrees of curvature of the molded bus board may be provided to accommodate specific packaging requirements.

Figure 16:
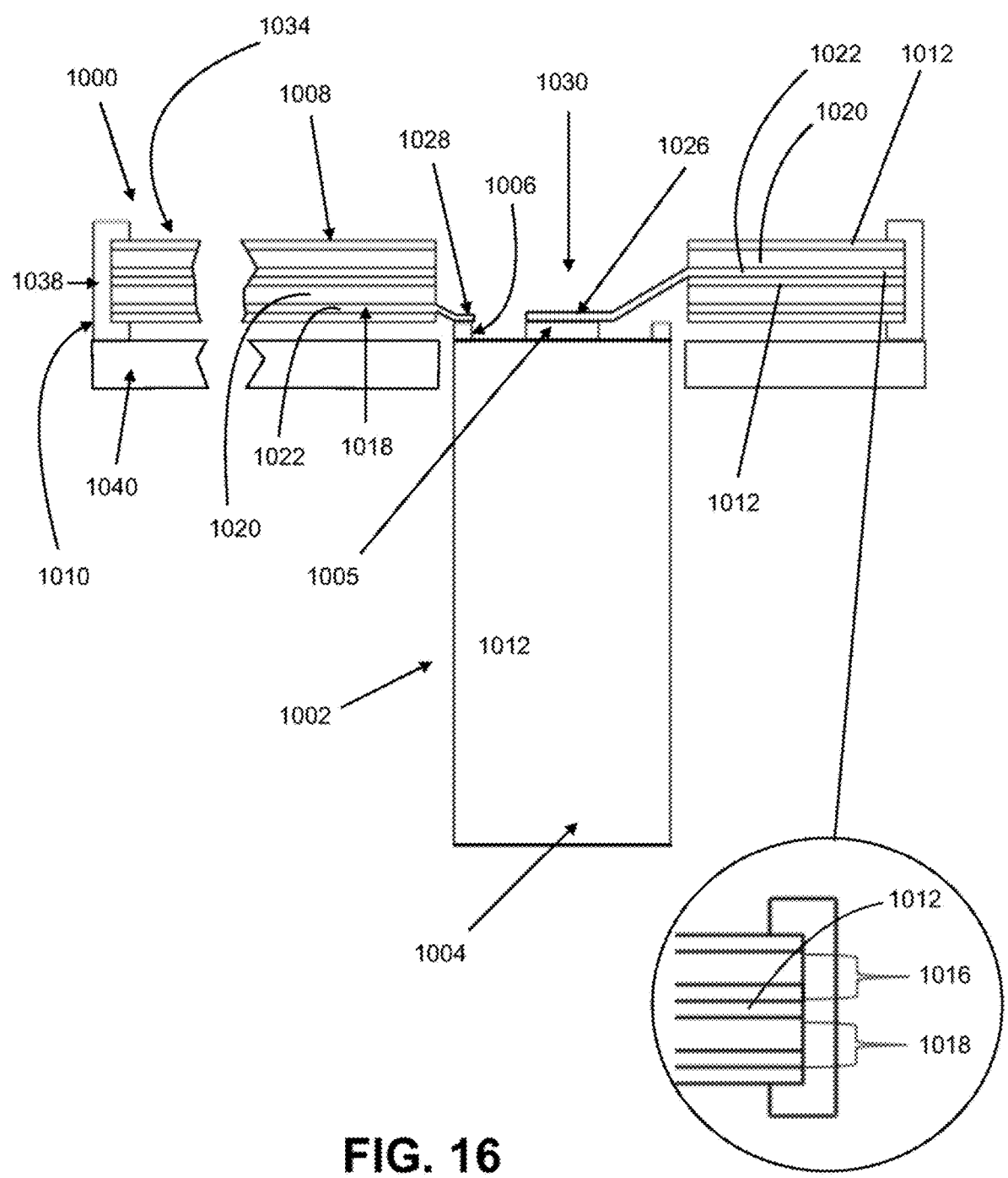
FIG. 16 shows a schematic sectional view of an electrical assembly having a thirteenth bus board embodied in accordance with the present disclosure, wherein a battery cell is shown connected to the thirteenth bus board.

Referring now to FIG. 16, there is shown an electrical assembly having a multilayer bus board 1000 that is being used to interconnect a plurality of battery cells 1002 of a battery module, which may be used in a battery system for a vehicle, such as an electric vehicle ("EV") or a hybrid electric vehicle ("HEV"). Although not shown, the battery module generally includes a housing enclosing a plurality of the battery cells 1002 and the multilayer bus board 1000. For purposes of ease of illustration, only one of the plurality of battery cells 1002 is shown.

Figure 17:
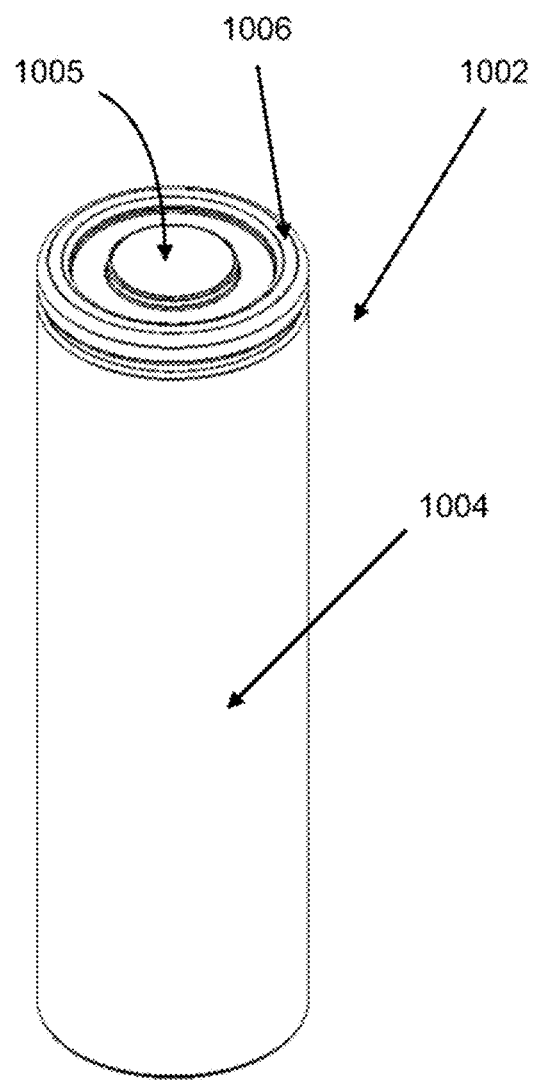
FIG. 17 shows a perspective view of the battery cell of the electrical assembly of FIG. 16.

As best shown in FIG. 17, each battery cell 1002 may be a rechargeable lithium ion (LI-ION) battery or other type of rechargeable battery. An example of a rechargeable LI-ION battery that may be used is an 18650 type LI-ION battery, having a cylindrical shape with a diameter of about 18 mm and a length of about 65 mm. Alternatively, other rechargeable battery form factors and/or chemistries may be used. In or more embodiments, including the one shown, each battery cell 1002 has a cylindrical case 1004 with first and second ends. A center positive terminal 1005 and a surrounding annular negative terminal 1006 are located at the first end.

Referring back to FIG. 16, the bus board 1000 generally includes a multilayer stacked assembly 1008 and a frame 1010. The multilayer stacked assembly 1008 includes a dielectric layer structure 1012 disposed between first and second conductive layer structures 1016, 1018. Optionally, two more dielectric layer structures 1012 may be provided, with one being disposed on top of the first conductive layer structure 1016 and one being disposed below the second conductive layer structure 1018, such as is shown.

The dielectric layer structures 1012 may each be a single layer of a dielectric material. In other embodiments, however, the dielectric layer structures 1012 may each be comprised of a plurality of layers or plys, which may be formed from the same or different material. The materials that may be used and the selection and arrangement of different types of plys in each of the dielectric layer structures 1012 may be the same as those described above with regard to the multilayer bus board 100 and its dielectric layers 104, 106.

The first and second conductive layer structures 1016, 1018 may each be a single layer of a conductive metal, such as copper or aluminum. In other embodiments, however, including the one shown in FIG. 16, the first and second conductive layer structures 1016, 1018 each include a primary layer 1020 and a connection layer 1022, with the primary layers 1020 being thicker than the connection layers 1022. Each primary layer 1020 is at least 1.25 times the thickness of its associated connection layer 1022 and more typically from about 1.5 times to about four times the thickness of its connection layer 1022, more preferably from about 2 times to about 3 times the thickness of its connection layer 1022. In one embodiment, each primary layer 1020 has a thickness of about 1 mm or greater, while each connection layer 1022 has a thickness of about 0.3 mm or less. The primary layers 1020 and the connection layers 1022 are composed of a conductive metal, such as copper, a copper alloy, aluminum or an aluminum alloy. In each of the first and second conductive layer structures 1016, 1018, the connection layer 1022 may be joined to the primary layer 1020, such as by fusion welding, brazing, clinching, cladding, soldering or other bonding methods. Alternately, the connection layer 1022 may simply be clamped by the frame 1010 to the primary layer 1020 in each of the first and second conductive layer structures 1016, 1018, as is discussed below.

The first and second conductive layer structures 1016, 1018 may each be one continuous structure, or may each comprise a plurality of sections, which are separated from each other by gaps or spaces. In this latter embodiment, each conductive layer structure 1016, 1018 may be formed so as to be interconnected by sacrificial tie bars to maintain the conductive layer structure 1016, 1018 as a single structure for ease of handling. The sacrificial tie bars may then be severed later, such as during or after the assembly of the bus bar 1000.

A plurality of openings is formed in each of the first and second conductive layer structures 1016, 1018, with a positive contact 1026 or a negative contact 1028 being disposed in and/or extending through each opening. In some embodiments, the first conductive layer structure 1016 may have contacts all of the same type (e.g. positive contacts 1026), while the second conductive layer structure 1018 may have contacts all of the other type (e.g. negative contacts 1028).

In other embodiments, the first and second conductive layer structures 1016, 1018 may each have both positive and negative contacts 1026, 1028. In the latter embodiments, the first and second conductive layer structures 1016, 1018 are each formed into separate sections, with one or more sections including only positive contacts 1026 and one or more sections including only negative contacts 1028.

Openings are also formed in each of the dielectric layer structures 1012. The openings in the dielectric layer structures 1012 and the openings in the first and second conductive layer structures 1016, 1018 are aligned such that a plurality of openings 1030 extend through the bus board 1000. As shown in FIG. 16, both a positive contact 1026 and a negative contact 1028 extend into each opening 1030. In each opening 1030, the positive contact 1026 is from one of the first and second conductive layer structures 1016, 1018, while the negative contact 1028 is from the other one of the first and second conductive layer structures 1016, 1018. A battery cell 1002 is associated with each opening 1030 and is connected to the contacts therein. As such, a given battery cell 1030 has one of its terminals connected to the first conductive layer structure 1016 and the other one of its terminals connected to the second conductive layer structure 1018. The positive and negative contacts 1026, 1028 are secured to the positive and negative terminals 1005, 1006 of the battery cells 1002, respectively, such as by electron beam welding or laser beam welding.

In each of the first and second conductive layer structures 1016, 1018, the positive and negative contacts 1026, 1028 are formed from the connection layer 1022. Each contact 1026, 1028 has a connector portion that is connected to the rest of the connection layer 1022. The connector portion extends through one or more of the openings in the layer structures and has a plurality of bends formed therein. The configuration of a connector portion is dependent on whether the contact is in the first conductive layer structure 1016 or in the second conductive layer structure 1018. More specifically, a connector portion in the first conductive layer structure 1016 is longer and has more pronounced bends than a connector portion in the second conductive layer structure 1018 in order to permit the connector portion in the first conductive layer structure 1016 to be bent over the second conductive layer structure 1018.

The multilayer construction of the first and second conductive layer structures 1016, 1018 facilitates the connection of the first and second conductive layer structures 1016, 1018 to the battery cells 1002, while still allowing them to handle the electric current produced by the battery cells 1002 without excessive resistance. The thinness of the connection layers 1022 allows the positive and negative contacts 1026, 1028 and their connector portions to be easily formed. Moreover, the thinness facilitates the welding of the positive and negative contacts 1026, 1028 to the positive and negative terminals 1005, 1006 of the battery cells 1002, respectively, such as by electron beam welding or laser beam welding.

The first and second conductive layer structures 1016, 1018 are configured for connecting together the battery cells 1002 in a desired circuit arrangement for the battery module. The circuit arrangement may have the battery cells 1002 connected together in series, parallel and/or combinations thereof. For example, a plurality of groups of battery cells 1002 may be electrically connected in series, wherein in each group, the battery cells 1002 are electrically connected in parallel.

The frame 1010 has a construction similar to that of the frame 110 of the multilayer bus board 100 described above. The frame 1010 mechanically maintains the integrity of the multilayer stacked assembly 1008, i.e., the frame 1010 mechanically holds the first and second conductive layer structures 1016, 1018 and the dielectric layer structure(s) 1012 in a secure aligned stacked arrangement. The frame 1010 may be molded of any suitable moldable or cured dielectric material, such as a thermoplastic, thermoset epoxy or other material that mechanically maintains the multilayer stacked assembly 1008 in secure aligned arrangement. The frame 1010 defines one or more enlarged openings 1034 and includes a peripheral portion that may be formed from a plurality of outer structures 1038 integrally joined together to have a rectangular or other type of configuration. An external surface of an outer one of the layer structures 1012, 1016, 1018 is exposed through the one or more openings 1034.

The frame 1010 may further include inner structures that are integral with the frame 1010 and are connected to the outer structures 1038. The inner structures help maintain the layer structures 1012, 1016, 1018 in a tightly stacked arrangement in areas away from the periphery of the assembly 1008. In particular, the inner structures help maintain the tight contact between the connection layer 1022 and the primary layer 1020 in each of the first and second conductive layer structures 1016, 1018. Some inner structures may extend parallel to the outer structures 1038, while other inner structures may extend perpendicular to outer structures 1038. For example, inner structures may extend laterally between opposing outer structures 1038. The inner structures may include standoffs, such as the standoffs 119 in the frame 110 of the multilayer bus board 100. In addition, one or more of the inner structures may include opposing clamping members between which the stacked assembly 1008 extends. The clamping members may press the stacked assembly 1008 together like a vice or clamp. It is preferred that the frame 1010 be formed (via molding) over the stacked assembly 1008, however, in an aspect of the disclosure, the frame 1010 can be premolded and then secured over the assembly 1008 in a subsequent step.

Since the multilayer stacked assembly 1008 is secured mechanically by the frame 1010, there is no need for adhesives, lamination or bonding processes as are employed in conventional laminated bus boards. Additionally, in the process of molding or setting the frame 1010, the frame material adheres to the edges of the layer structures 1012, 1016, 1018. Good adhesion of the plastic frame 1010 to the dielectric layer structures 1012 provides beneficial insulation around the periphery of the conductive layer structures and thereby improves the creep distance at the edges of the assembly 1008.

The multilayer bus board 1000 may be supported on, and secured to, a cell carrier 1040 that holds the battery cells 1002 in place, within the housing of the battery module. The cell carrier 1040 includes a plurality of openings, one for each battery cell 1002. The multilayer bus board 1000 may be mounted to the cell carrier 1040 through the standoffs of its frame 1010.

The conductive layers of the multilayer bus boards described herein may be formed as a single conductive substrate or plane, they may also be provided in the form of a flex circuit that includes plural conductive traces or planes on the same layer of the multilayer stacked assembly. More specifically, the flex circuits may include signal or power paths, multiple power planes, or combinations thereof. Furthermore, one or more of the layers may include multiple conductive paths or planes which are not integrated within a flex circuit. Layers including conductive paths or planes have dielectric layer structures provided on either side thereof to prevent shorting to conductive paths or planes on an adjacent layer, except for outer layers including conductive paths or planes which may optionally include a dielectric layer as the most outermost layer of the multilayer stacked assembly.

As noted above, each bus board layer may include more than one conductive trace or plane. The pre-stamped traces and/or planes may include tie bars that maintain the alignment of the traces or planes within the respective layer. The pre-stamped layer may be included in the multilayer stack and the frame then molded over the multilayer stacked assembly. Following molding of the frame the tie bars may be drilled or stamped to create the independent electrical circuits on the respective layer. More specifically, holes in conductive paths or planes on different layers of the bus board may be sized such that upon insertion of the resistive wire therethrough, the resistive wire makes conductive contact with the respective paths or planes on the different layers. Other paths or planes that are not dielectric layer structures either have oversized openings surrounding the through hole for the resistive wire so that the resistive wire does not make conductive contact on the respective layer or conductive material is not provided in the vicinity of the through hole on the layer for which no conductive connection is desired.

A molded sleeve may be provided in any layer of the stacked assembly. As discussed above, when the sleeve is in the outer or outermost layers of multilayer stacked assembly, an oversized opening may be provided in such layers to permit the molding of the sleeve with the frame. If the sleeve is to be provided in one of the inner layers, a passage for the molten plastic is provided through the conductive and dielectric layer structures to permit the flow of plastic to the void in which the sleeve is to be formed. Mold tooling may be employed as is known in the art, such as a pin extending through the multilayer stacked assembly, to prevent the flow of plastic into the central portion of the void in which the sleeve is formed. Alternatively, the through hole may be drilled or redrilled after the molding process to remove plastic from the through hole through which the conductive contact will pass.

The exteriors of the multilayer busboards described above, including but not limited to the multilayer busboard 100, may be aluminized, i.e., coated with aluminum or an aluminum silicon alloy, to facilitate connections to aluminum components. All, or only certain portions, of the exterior of a multilayer busboard may be aluminized.

Instead of being aluminized, the exterior of mutlilayer busboards described above, including but not limited to the multilayer busboard 100, may be powder coated with an insulating resin, such as an epoxy resin. With such powder coating, the outer dielectric layer structures 106 may be eliminated.

While the invention has been described in detail herein in accordance with certain preferred embodiments thereof, many modifications and changes therein may be affected by those skilled in the art without departing from the spirit of the invention. Accordingly, it is our intent to be limited only by the scope of the appending claims and not by way of the details and instrumentalities describing the embodiments shown herein.

What is claimed is:

1. An electrical assembly, comprising:
a multilayer bus board comprising:
a multilayer stacked assembly having a plurality of layer structures including a pair of electrically conductive layer structures and a dielectric layer structure disposed between and adjoining each of the conductive layer structures; and
a molded frame formed of an insulating polymer material, the frame having a peripheral portion encapsulating end portions of the dielectric layer structure and the conductive layer structures to maintain the conductive layer structures and the dielectric layer structure in position relative to each other, the frame defining an enlarged opening through which an external surface of an outer one of the layer structures is exposed; and
an electrical device electrically connected to one or both of the conductive layer structures; and
wherein the layer structures are mechanically held together by the frame and are not secured to each other by adhesive, lamination or other type of bonding.

2. The electrical assembly of claim 1, further comprising a contact that extends through an opening in the dielectric layer structure to electrically connect the electrical device to a first one of the conductive layer structures.

3. The electrical assembly of claim 2, wherein a plurality of aligned holes extend through a plurality of the layer structures, and wherein the contact extends through at least a first one of the aligned holes, which comprises the opening in the dielectric layer structure.

4. The electrical assembly of claim 3, wherein the frame includes a dielectric sleeve disposed within at least a second one of the aligned holes, and wherein the contact extends through the dielectric sleeve.

5. The electrical assembly of claim 4, wherein the second one of the aligned holes extends through a second one of the conductive layer structures.

6. The electrical assembly of claim 3, wherein the contact is part of the first one of the conductive layer structures, and wherein the electrical device is a battery cell having a terminal to which the contact is welded.

7. The electrical assembly of claim 6, wherein the contact is a positive contact and the terminal of the battery is a positive terminal, and wherein a second one of the conductive layer structures forms part of a negative contact and the battery cell further has a negative terminal to which the negative contact is welded.

8. The electrical assembly of claim 7, wherein the first and second ones of the conductive layer structures each comprise a connection layer adjoining a primary layer, and wherein the positive contact is formed from the connection layer of the first one of the conductive layer structures and the negative contact is formed from the connection layer of the second one of the conductive layer structures.

9. The electric assembly of claim 8, wherein the connection layers are thinner than the primary layers.

10. The electrical assembly of claim 1, wherein the peripheral portion of the frame comprises a plurality of outer structures, and wherein the frame further comprises a plurality of inner structures that are joined to, and disposed inward from, the outer structures.

11. The electrical assembly of claim 10, wherein the inner structures include standoffs for mounting the multilayer bus board to an adjunct structure.

12. The electrical assembly of claim 11, wherein the adjunct structure is a printed circuit board.

13. The electrical assembly of claim 10, wherein the multilayer stacked assembly extends through one of the inner structures.

14. The electrical assembly of claim 1, wherein the dielectric layer structure comprises a plurality of dielectric plies.

15. The electric assembly of claim 1, wherein the outer one of the layer structures is one of the conductive layer structures, and wherein the outer one of the layer structures has an internal surface adjoining the dielectric layer structure.

16. The electric assembly of claim 15, wherein the external surface of the outer one of the layer structures is surface treated to increase heat dissipation.

17. The electric assembly of claim 15, wherein the external surface of the outer one of the layer structures is powder coated with an epoxy resin.

18. The electric assembly of claim 1, wherein a plurality of aligned holes extend through a plurality of the layers structures, and wherein the frame includes a dielectric insulator disposed within at least a first one of the aligned holes; and
wherein the electrical device comprises two contact leads, one of the contact leads being electrically connected to a first one of the conductive layer structures and being insulated by the dielectric insulator from a second one of the conductive layer structures, while the other one of the contact leads being electrically connected to the second one of the conductive layer structures and being insulated by the dielectric insulator from the first one of the conductive layer structures.

19. The electric assembly of claim 18, wherein the electrical device is selected from a group comprising: an ammeter shunt, thermistor, diode, sensor, current sensor, resistor, capacitor and combinations thereof.

20. The electric assembly of claim 1, wherein the outer one of the layer structures is a first one of the conductive layer structures, wherein a second one of the conductive layer structures is bent to form an exposed portion, and wherein the electrical device has first and second leads, the first lead being electrically connected to the first one of the conductive layer structures and the second lead being electrically connected to the exposed portion of the second one of the conductive layer structures.

* * * * *